US010629267B2

(12) United States Patent
Lee et al.

(10) Patent No.: US 10,629,267 B2
(45) Date of Patent: Apr. 21, 2020

(54) NONVOLATILE MEMORY DEVICE AND METHOD OF PROGRAMMING IN THE SAME

(71) Applicant: Samsung Electronics Co., Ltd., Suwon-si, Gyeonggi-do (KR)

(72) Inventors: Kang-Bin Lee, Suwon-si (KR); Il-Han Park, Suwon-si (KR); Jong-Hoo Jo, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/213,420

(22) Filed: Dec. 7, 2018

(65) Prior Publication Data

US 2019/0318784 A1 Oct. 17, 2019

(30) Foreign Application Priority Data

Apr. 16, 2018 (KR) .................. 10-2018-0043766

(51) Int. Cl.
| | | |
|---|---|---|
| *G11C 16/10* | (2006.01) | |
| *G11C 16/04* | (2006.01) | |
| *G11C 16/26* | (2006.01) | |
| *G11C 16/34* | (2006.01) | |
| G11C 16/08 | (2006.01) | |
| H01L 27/11556 | (2017.01) | |
| H01L 27/11582 | (2017.01) | |

(52) U.S. Cl.
CPC .......... *G11C 16/10* (2013.01); *G11C 16/0483* (2013.01); *G11C 16/26* (2013.01); *G11C 16/3427* (2013.01); *G11C 16/08* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 7,952,929 B2 | 5/2011 | Kim et al. | |
| 8,174,902 B2 | 5/2012 | Lee et al. | |
| 9,165,660 B2 | 10/2015 | Lee et al. | |
| 9,349,471 B2 | 5/2016 | Yun | |
| 9,401,210 B2 | 7/2016 | Kwon et al. | |
| 9,576,665 B2 | 2/2017 | Akamine et al. | |
| 9,761,319 B1 | 9/2017 | Chang et al. | |
| 2010/0027332 A1* | 2/2010 | Lee .................... | G11C 16/0483 365/185.03 |
| 2017/0076799 A1 | 3/2017 | Namai | |

* cited by examiner

*Primary Examiner* — James G Norman
(74) *Attorney, Agent, or Firm* — Myers Bigel, P.A.

(57) ABSTRACT

In a method of programming in a nonvolatile memory device, channels of a plurality of cell strings are precharged through ground selection transistors by a precharge voltage of a source line. A turn-on voltage is applied to a selected ground selection transistor of a selected cell string among the plurality of cell strings, during a verification read period of an N-th program loop. The turn-on voltage applied to the selected ground selection transistor is maintained to precharge the channels for an (N+1)-th program loop, without recovery after the verification read period of the N-th program loop is finished. Power consumption is reduced and an operation speed is increased by maintaining the turn-on voltage of the selected ground selection line to precharge the channels of the cell strings without recovery after the verification read operation is finished.

20 Claims, 19 Drawing Sheets

NONVOLATILE MEMORY DEVICE AND METHOD OF PROGRAMMING IN THE SAME

CROSS-REFERENCE TO RELATED APPLICATION

This U.S. non-provisional application claims priority under 35 USC § 119 to Korean Patent Application No. 10-2018-0043766, filed on Apr. 16, 2018, in the Korean Intellectual Property Office (KIPO), the disclosure of which is incorporated by reference in its entirety herein.

BACKGROUND

Example embodiments relate generally to semiconductor integrated circuits, and more particularly to a nonvolatile memory device and a method of programming in a nonvolatile memory device.

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and lose the stored data when power is off. Nonvolatile memory devices, such as flash memory devices, may maintain stored data even though power is off. Volatile memory devices are widely used as main memories of various apparatuses, while nonvolatile memory devices are widely used for storing program codes and/or data in various electronic devices, such as computers, mobile devices, etc.

Recently, nonvolatile memory devices including three-dimensional structures such as vertical NAND memory devices have been developed to increase the degree of device integration and memory capacity of the nonvolatile memory devices. Along with increases in the integration degree and memory capacity, disturbance on unselected memory cells may increase while selected memory cells are programmed.

SUMMARY

Some example embodiments may provide a nonvolatile memory device and a method of programming capable of enhancing efficiency of a programming operation.

According to example embodiments, a method of programming a nonvolatile memory device, includes a plurality of cell strings. The plurality of cell strings includes a first cell string including a first string selection transistor, a first plurality of memory cells and a first ground selection transistor connected between a bit line and a source line, and a second cell string including a second string selection transistor, a second plurality of memory cells and a second ground selection transistor connected between the bit line and the source line. The method includes precharging a first channel of the first cell string through the first ground selection transistor by a precharge voltage of the source line and precharging a second channel of the second cell string through the second ground selection transistor by the precharge voltage of the source line, applying a turn-on voltage to a selected ground selection transistor including the first ground selection transistor of a selected cell string including the first cell string, during a verification read period of an N-th program loop. N is a natural number. The method includes maintaining the turn-on voltage applied to the selected ground selection transistor to precharge the first channel of the first cell string for an (N+1)-th program loop, without recovery after the verification read period of the N-th program loop is finished.

According to example embodiments, a method of programming a nonvolatile memory device, which includes a plurality of cell strings. The plurality of cell strings includes a first cell string of the plurality of cell strings including a first string selection transistor, a first plurality of memory cells and a first ground selection transistor connected between a bit line and a source line, and a second cell string of the plurality of cell strings including a second string selection transistor, a second plurality of memory cells and a second ground selection transistor connected between the bit line and the source line. The method includes applying a turn-on voltage to a selected ground selection transistor including the first ground selection transistor of a selected cell string including the first cell string, during a verification read period of an N-th program loop, where N is a natural number, maintaining the turn-on voltage applied to the selected ground selection transistor, without recovery after the verification read period of the N-th program loop is finished, applying the turn-on voltage to an unselected ground selection transistor including the second ground selection transistor of an unselected cell string including the second cell string at a time point when the verification read period of the N-th program loop is finished, and precharging a first channel of the first cell string through the first ground selection transistor by a precharge voltage of the source line during a read recovery period of the N-th program loop and a bit line setup period of an (N+1)-th program loop, for programming of the (N+1)-th program loop.

According to example embodiments, a nonvolatile memory device includes at least one memory block including a plurality of cell strings. The plurality of cell strings includes a first string selection transistor, a first plurality of memory cells and a first ground selection transistor connected between a bit line and a source line, and a second cell string of the plurality of cell strings including a second string selection transistor, a second plurality of memory cells and a second ground selection transistor connected between the bit line and the source line. The nonvolatile memory device includes a control circuit configured to control a program operation such that a turn-on voltage applied to a selected ground selection transistor including the first ground selection transistor of a selected cell string among the plurality of cell strings to precharge a first channel for an (N+1)-th program loop, without recovery even after the verification read period of the N-th program loop is finished.

The nonvolatile memory device and the programming method according to example embodiments may reduce power consumption and increase an operation speed by maintaining the turn-on voltage of the selected ground selection line to precharge the channels of the cell strings without recovery even after the verification read operation is finished.

BRIEF DESCRIPTION

Example embodiments of the present disclosure will be more clearly understood from the following detailed description taken in conjunction with the accompanying drawings.

DETAILED DESCRIPTION OF THE EMBODIMENTS

Figure 1:
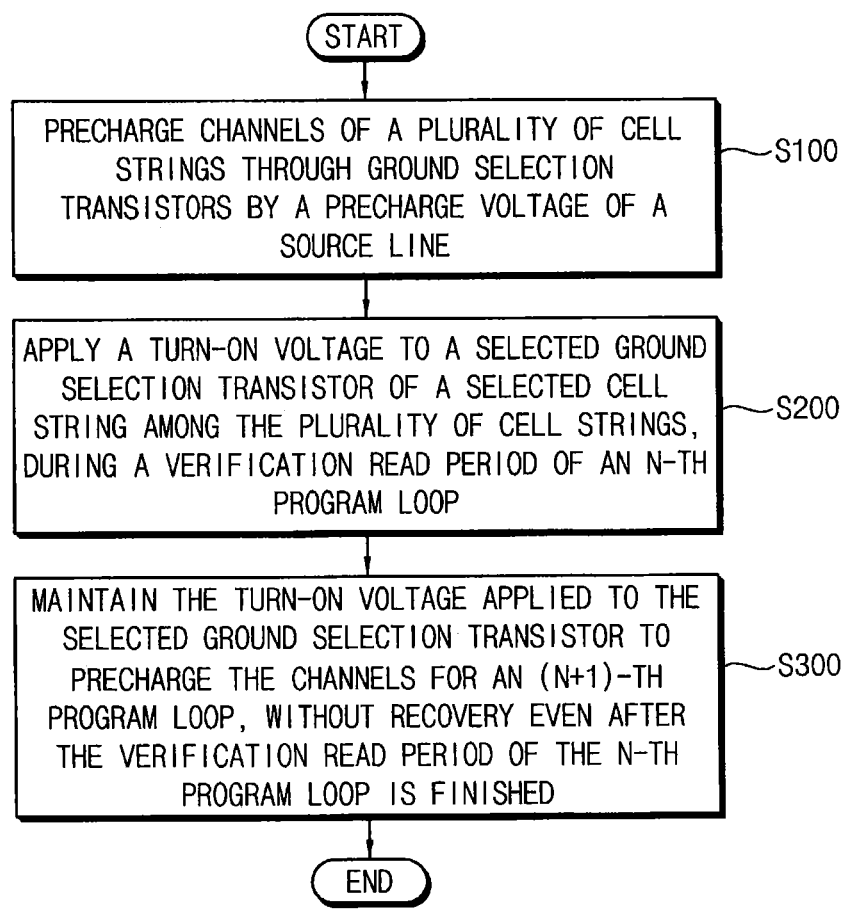
FIG. 1 is a flow chart illustrating programming a nonvolatile memory device according to example embodiments of the present inventive concept.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

Various example embodiments will be described more fully hereinafter with reference to the accompanying drawings, in which some example embodiments are shown. In the drawings, like numerals refer to like elements throughout. The repeated descriptions may be omitted.

FIG. 1 is a flow chart illustrating a method of programming a nonvolatile memory device according to example embodiments.

FIG. 1 illustrates programming a nonvolatile memory device including a plurality of cell strings, where each cell string includes a string selection transistor, a plurality of memory cells and a ground selection transistor connected between a bit line and a source line. According to example embodiments, the nonvolatile memory device may include a three-dimensional NAND flash memory device or a vertical NAND flash memory device.

Referring to FIG. 1, channels of a plurality of cell strings are precharged through ground selection transistors by a precharge voltage of a source line (S100). In general, the channels of the cell strings may be precharged through string selection transistors by a setup voltage of a bit line during a bit line set up period. However, in the case of programming the memory cells earlier for reducing program disturbance for the memory cells which are located at an upper position, the channels cannot be precharged or initialized through the string selection transistors if any memory cell above the selected memory cell has been programmed from an erased state to a programmed state. Accordingly, the channels of the cell strings may be precharged through the ground selection transistors when the memory cells are programmed earlier than the memory cells are located at an upper position.

A turn-on voltage is applied to a selected ground selection transistor of a selected cell string among the plurality of cell strings, during a verification read period of an N-th program loop, where N is a natural number (S200).

According to example embodiments, the turn-on voltage applied to the selected ground selection transistor is maintained to precharge the channels for an (N+1)-th program loop, without recovery even after the verification read period of the N-th program loop is finished (S300).

The three-dimensional NAND flash memory device may be more vulnerable to the program disturbance as the size or the critical dimension (CD) of the channel hole is smaller. In case of a multiple level cell (MLC), the bit number programmed in each cell may be increased. The number of the program loops is increased due to the increased number of the programmed states and thus the performance degradation due to the program disturbance may be increased. Accordingly, the program operation may be performed along the direction of a size decrease of the channel hole as will be described below. When the program operation is performed along the direction of the size decrease of the channel hole, a bias voltage may be applied to a ground selection line and an unselect string initial precharge (USIP) may be performed using a voltage of a source line.

In general, when a verification read operation is finished, the bias voltages of all of the gate lines including the word lines, the string selection lines and the ground selection lines are recovered to 0 V for the programming operation of the next program loop. After the recovery, the bias voltage or the turn-on voltage is applied to the ground selection lines for the USIP to precharge the channels of the cell strings during a bit line setup period of the next program loop.

In contrast, according to example embodiments, the channels of the cell strings may be precharged by maintaining the turn-on voltage of the ground selection lines with recovery, even after the verification read operation is finished. In this case, the current due to the voltage transition of the ground selection lines may be suppressed and thus the power consumption may be reduced. In addition, the start time point of the bit line setup period may be advanced by omitting the recovery of the voltage of the ground selection lines and thus the entire program time may be reduced and the operation speed of the nonvolatile memory device may be enhanced.

Figure 2:
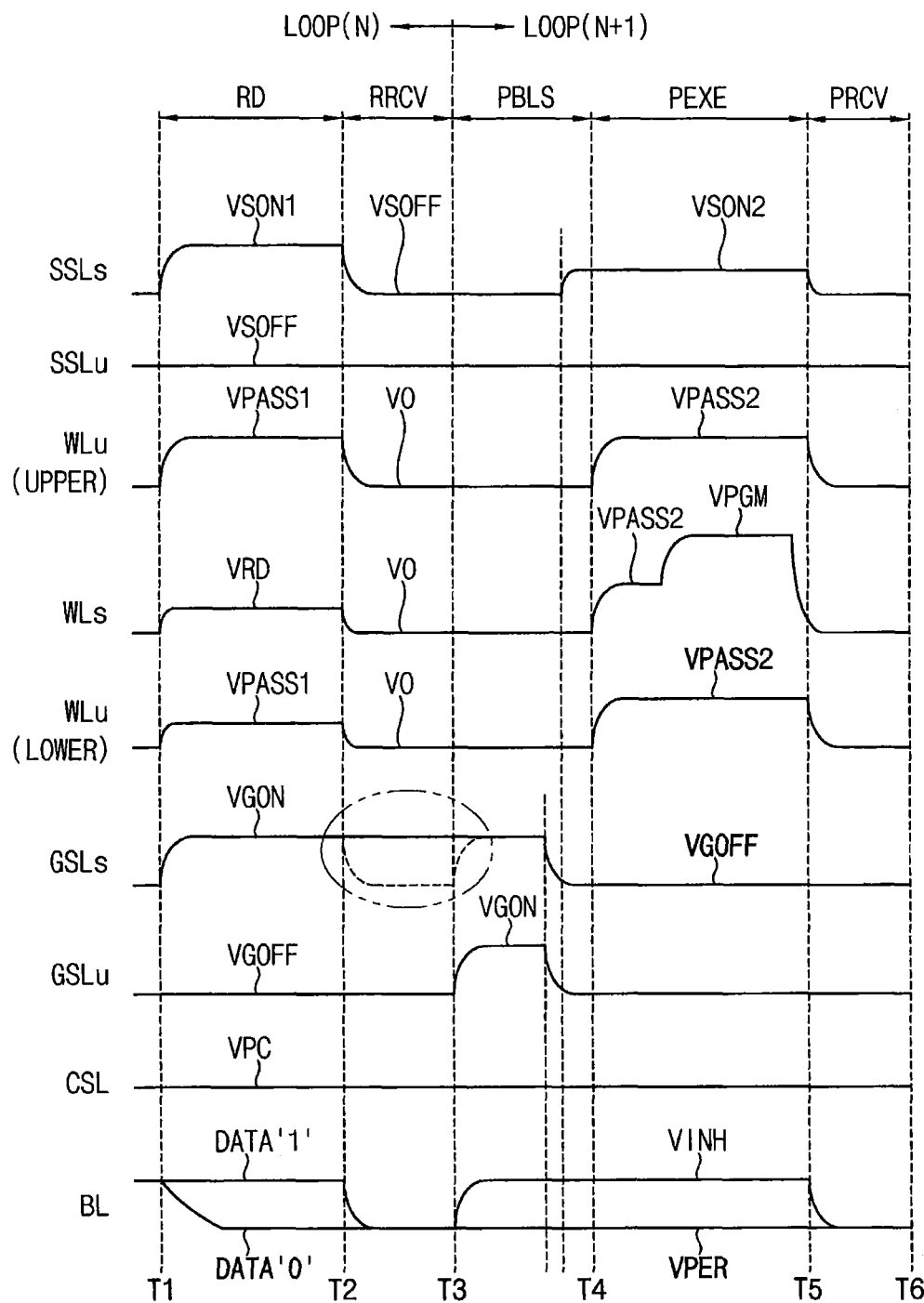
FIG. 2 is a timing diagram illustrating programming a nonvolatile memory device according to example embodiments of the present inventive concept.

FIG. 2 is a timing diagram illustrating programming a nonvolatile memory device according to example embodiments.

FIG. 2 illustrates a verification read period RD and a read recovery period RRCV of an N-th program loop LOOP(N) and a bit line setup period PBLS, a program execution period PEXE and a program recovery period PRCV of an (N+1)-th program loop LOOP(N+1). Time points T1~T6 represents boundaries of the periods.

Referring to FIG. 2, during the verification read period RD, a turn-on voltage VSON1 is applied to the selected string selection line SSLs and a turn-off voltage VSOFF is applied to an unselected string selection line SSLu. Thus a selected string selection transistor driven by the selected string selection line SSLs is turned on and an unselected string selection transistor driven by the unselected string selection line SSLu is turned off during the verification read period RD.

During the verification read period RD, a read pass voltage VPASS1 is applied to an unselected word line WLu and a verification read voltage VRD is applied to a selected word line WLs. The read pass voltage VPASS1 has a voltage level for turning on the memory cell regardless of its program state and the verification read voltage VRD has a voltage level for determining the threshold voltage level of a selected memory cell. WLu(UPPER) indicates a word line or word lines disposed above the selected word line WLs and WLu(LOWER) indicates a word line or word lines disposed below the selected word line WLs.

During the verification read period RD, a turn-on voltage VGON is applied to a selected ground selection line GSLs and a turn-off voltage VGOFF is applied to an unselected ground selection line GSLu. Thus a selected ground selection transistor driven by the selected ground selection line GSLs is turned on and an unselected ground selection transistor driven by the unselected ground selection line GSLu is turned off during the verification read period RD.

As a result, a voltage of a bit line is developed to a voltage corresponding to '1' or '0' depending on the threshold voltage state of the selected memory cell. The data stored in the selected memory cell may be determined by sensing the voltage development of the bit line. Even though not illustrated in FIG. 2, during a bit line precharge period before the verification read period RD, all of the bit lines may be initialized by the same bit line precharge voltage.

At the time point T2 of the end of the verification read period RD or the start of the read recovery period RRCV, the selected string selection line SSLs is recovered to the turn-off voltage VSOFF, the unselected word line WLu and the selected word line WLs are recovered to an initial voltage V0. In contrast, the turn-on voltage VGON of the selected ground selection line GSLs is not recovered and it is maintained at the time point T2 of the end of the verification read period RD.

The turn-on voltage VGON of the selected ground selection line GSLs may be maintained without recovery after the time point T3 of the start of the bit line setup period PBLS. Accordingly the channel of the selected cell string may be precharged or initialized to a precharge voltage VPC during the read recovery period RRCV and the bit line setup period PBLS while the selected ground selection transistor is turned on.

At the time point T3 of the start of the bit line setup period PBLS, the turn-on voltage VGON is applied to the unselected ground selection line GSLu. Thus the channel of the unselected cell string may be precharged or initialized to the precharge voltage VPC during the bit line setup period PBLS while the unselected ground selection transistor is turned on.

Conventionally, the turn-on voltage VGON of the selected ground selection line GSLs applied to the selected ground selection transistor is recovered to the turn-off voltage VGOFF at the time point T2 of the end of the verification read period RD, and then the turn-on voltage VGON is applied to the selected ground selection line GSLs in addition to the unselected ground selection line GSLu at the time point T3 of the start of the bit line setup period PBLS. In contrast, according to example embodiments, the turn-on voltage VGON of the selected ground selection line GSLs applied to the selected ground selection transistor is maintained to precharge the channels for an (N+1)-th program loop LOOP(N+1), without recovery even after the verification read period RD of the N-th program loop LOOP(N) is finished. The turn-on voltage VGON of the selected ground selection line GSLs and the unselected ground selection line GSLu may be recovered to the turn-off voltage VGOFF before the time point T4 of the start of the program execution period PEXE.

As such, the current due to the voltage transition of the selected ground selection line GSLs may be suppressed and thus the power consumption may be reduced by maintaining the turn-on voltage VGON of the selected ground selection line GSLs to precharge the channels of the cell strings without recovery even after the verification read operation RD is finished.

At the time point T3 of the start of the bit line setup period PBLS, a program inhibition voltage VINH or a program permission voltage VPER may be applied to the bit line BL depending on the value of the write data.

At the time point T4 of the start of the program execution period PEXE, a program pass voltage VPASS2 is applied to the selected word line WLs and the unselected word line WLu. After a predetermined time interval, a program voltage VPGM is applied to the selected word line WLs. During the program execution period PEXE, a turn-on voltage VSON2 is applied to the selected string selection line SSLs and the turn-off voltage VSOFF of the unselected string selection line SSLu is maintained. The turn-on voltage VSON2 during the program execution period PEXE may be lower than the turn-on voltage VSON1 during the verification read period RD.

The program pass voltage VPASS2 applied to the unselected word line WLu may be maintained until the time point T5 of the end of the program execution period PEXE. The channel voltage of the unselected cell strings connected to the unselected string selection line SSLu may be increased by a self-boosting effect.

The selected memory cells connected to the selected word line WLs may be programmed by the program voltage VPGM applied to the selected word line WLs depending on the setup voltage of the bit line BL. The unselected cell string maintain the boosted state while the program voltage VPGM is applied to the selected word line WLs, and thus the programming of the memory cells of the unselected cell string connected to the selected word line WLs may be prevented.

At the time point T5 of the end of the program execution period PEXE and/or the start of the program recovery period PRCV, the turn-on voltage VSON2 of the selected string selection line SSLs is recovered to the turn-off voltage VSOFF, and the program pass voltage VPASS2 of the unselected word line WLu and the program voltage VPGM of the selected word line WLs may be recovered to the initial voltage V0. As used herein, the term "and/or" includes any and all combinations of one or more of the associated listed items. Expressions such as "at least one of," when preceding a list of elements, modify the entire list of elements and do not modify the individual elements of the list.

Figure 3:
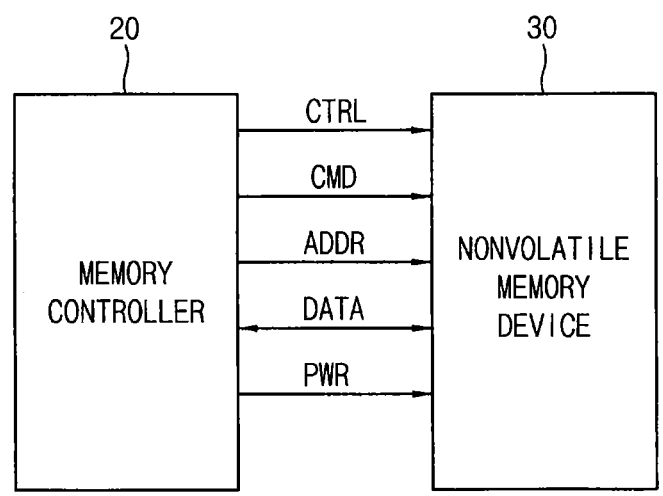
FIG. 3 is a block diagram illustrating a memory system according to example embodiments of the present inventive concept.

FIG. 3 is a block diagram illustrating a memory system according to example embodiments.

Referring to FIG. 3, a memory system 10 may include a memory controller 20 and at least one memory device 30.

The memory device 30 may be a nonvolatile memory device as described herein. The memory system 10 may include data storage media based on flash memory such as a memory card, a universal serial bus (USB) memory and solid state drive (SSD).

The nonvolatile memory device 30 may perform a read operation, an erase operation, a program operation, and/or a write operation under control of the memory controller 20. The nonvolatile memory device 30 receives a command CMD, an address ADDR and data DATA through input/output lines from the memory controller 20 for performing such operations. In addition, the nonvolatile memory device 30 receives a control signal CTRL through a control line from the memory controller 20. In addition, the nonvolatile memory device 30 receives a power PWR through a power line from the memory controller 20.

Figure 4:
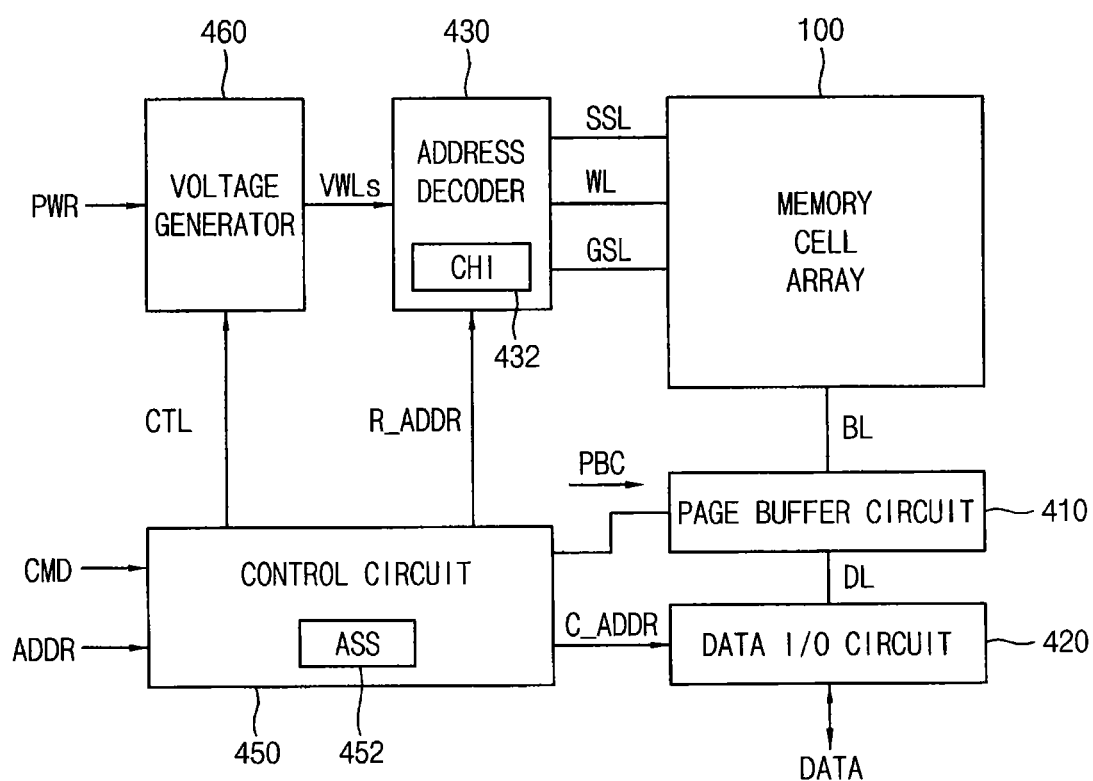
FIG. 4 is a block diagram illustrating example embodiments of a nonvolatile memory device according to some embodiments of the present inventive concept.

FIG. 4 is a block diagram illustrating an example embodiment of a nonvolatile memory device.

Referring to FIG. 4, the nonvolatile memory device 30 includes a memory cell array 100, a page buffer circuit 410, a data input/output circuit 420, an address decoder 430, a control circuit 450, and a voltage generator 460.

The memory cell array 100 may be coupled to the address decoder 430 through a plurality of string selection lines SSL, a plurality of word lines WL, and a plurality of ground selection lines GSL. In addition, the memory cell array 100 may be coupled to the page buffer circuit 410 through a plurality of bit lines BL.

The memory cell array 100 may include a plurality of memory cells coupled to the plurality of word lines WL and the plurality of bit lines BL. In some example embodiments, the memory cell array 100 may be a three-dimensional memory cell array, which is formed on a substrate in a three-dimensional structure (or a vertical structure). In this case, the memory cell array 100 may include a plurality of NAND strings that are vertically oriented such that at least one memory cell is located over another memory cell.

The control circuit 450 may receive a command (signal) CMD and an address (signal) ADDR from the memory controller 20. The control circuit 450 may control erasure, programming and read operations of the nonvolatile memory device 30 based on the command signal CMD and the address signal ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 450 may generate the control signals CTL, which is used for controlling the voltage generator 460, and may generate the page buffer control signal PBC for controlling the page buffer circuit 410, based on the command signal CMD, and generate the row address R_ADDR and the column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 100 through the plurality of string selection lines SSL, the plurality of word lines WL, and the plurality of ground selection lines GSL. During the program operation or the read operation, the address decoder 430 may determine one of the plurality of word lines WL as a selected word line and determine the rest of the plurality of word lines WL, except for the selected word line, as unselected word lines, based on the row address R_ADDR.

In addition, during the program operation or the read operation, the address decoder 430 may determine one of the plurality of string selection lines SSL as a selected string selection line and determine the rest of the plurality of string selection lines SSL except for the selected string selection line as unselected string selection lines based on the row address R_ADDR.

The voltage generator 460 may generate word line voltages VWL, which may be needed for the operation of the memory cell array 100 of the nonvolatile memory device 30, based on the control signals CTL. The voltage generator 460 may receive the power PWR from the memory controller 20. The word line voltages VWL may be applied to the plurality of word lines WL through the address decoder 430.

For example, during the program operation, the voltage generator 460 may apply a program voltage to the selected word line and may apply a program pass voltage to the unselected word lines. In addition, during the program verification operation, the voltage generator 460 may apply a program verification voltage to the first word line and may apply a verification pass voltage to the unselected word lines. It will be understood that, although the terms first, second, third, etc. may be used herein to describe various elements, elements should not be limited by these terms; rather, these terms are only used to distinguish one element from another element. Thus, a first element discussed below could be termed a second element without departing from the scope of the present inventive concepts.

In addition, during the normal read operation, the voltage generator 460 may apply a read voltage to the selected word line and may apply a read pass voltage to the unselected word lines. During the data recover read operation, the voltage generator 460 may apply the read voltage to a word line adjacent to the selected word line and may apply a recover read voltage to the selected word line.

The page buffer circuit 410 may be coupled to the memory cell array 100 through the plurality of bit lines BL. The page buffer circuit 410 may include a plurality of buffers. In some example embodiments, each buffer may be connected to one bit line. In other example embodiments, each buffer may be connected to two or more bit lines.

The page buffer circuit 410 may temporarily store data to be programmed in a selected page or data read out from the selected page of the memory cell array 100.

The data input/output circuit 420 may be coupled to the page buffer circuit 410 through data lines DL. During the program operation, the data input/output circuit 410 may receive program data DATA received from the memory controller 20 and provide the program data DATA to the page buffer circuit 410 based on the column address C_ADDR received from the control circuit 450. During the read operation, the data input/output circuit 420 may provide read data DATA, having been read from the memory cell array 100 and stored in the page buffer circuit 410, to the memory controller 20 based on the column address C_ADDR received from the control circuit 450.

In addition, the page buffer circuit 410 and the data input/output circuit 420 may read data from a first area of the memory cell array 100 and write the read data to a second area of the memory cell array 100 (e.g., without transmitting the data to a source external to the nonvolatile memory device 30, such as to the memory controller 20). That is, the page buffer circuit 410 and the data input/output circuit 420 may perform a copy-back operation.

The address decoder 430 may include a channel initializer CHI 432. In general, a channel initialization is performed through the string selection line and the bit line. However, when the memory cell adjacent to the string selection transistor is programmed first, the channel initialization or the channel precharge may not be performed through the string selection transistor and the bit line. The channel initializer 432 may determine a proper program order and perform the channel initialization based on the program order. For example, the channel initializer 432 may determine time points of applying the voltages to the string selection line, the ground selection line and the source line.

The control circuit 430 may include an address scramble selector ASS 452. The address scramble selector 452 may store channel hole profile information of the cell strings included in the memory cell array 100. The channel hole profile may be defined during the manufacturing stage of the nonvolatile memory device 30. The address scramble selector 452 may select a word line corresponding to a received address ADDR among a plurality of word lines based on the channel hole profile information. The address scramble indicates a method of mapping the address to the word line or the memory cells connected to the word line.

Hereinafter, a first direction D1 indicates a direction perpendicular to an upper surface of a semiconductor substrate, and a second direction D2 and a third direction D3 indicate two directions parallel to the upper surface of the semiconductor substrate. For example, the second direction and the third direction D3 may be perpendicular to each other. The first direction D1 may be referred to as a vertical direction, the second direction D2 may be referred to as a row direction and the third direction D3 may be referred to as a column direction. The direction indicated by an arrow in figures and the opposite direction may be considered as the same direction.

Figure 5:
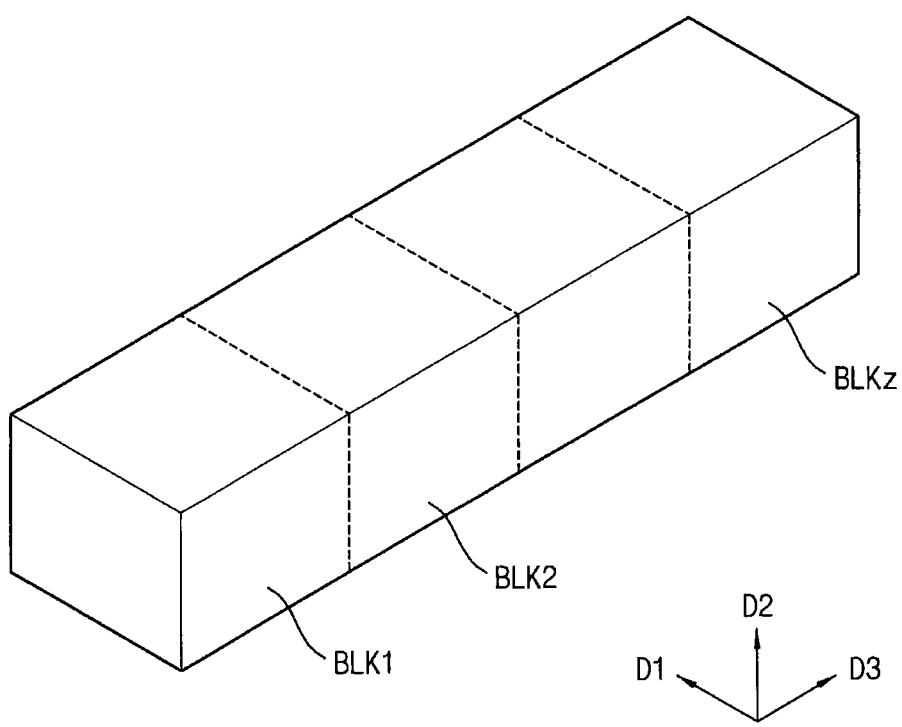
FIG. 5 is a block diagram illustrating a memory cell array included in the nonvolatile memory device of FIG. 4 according to some embodiments of the present inventive concept.
Figure 6:
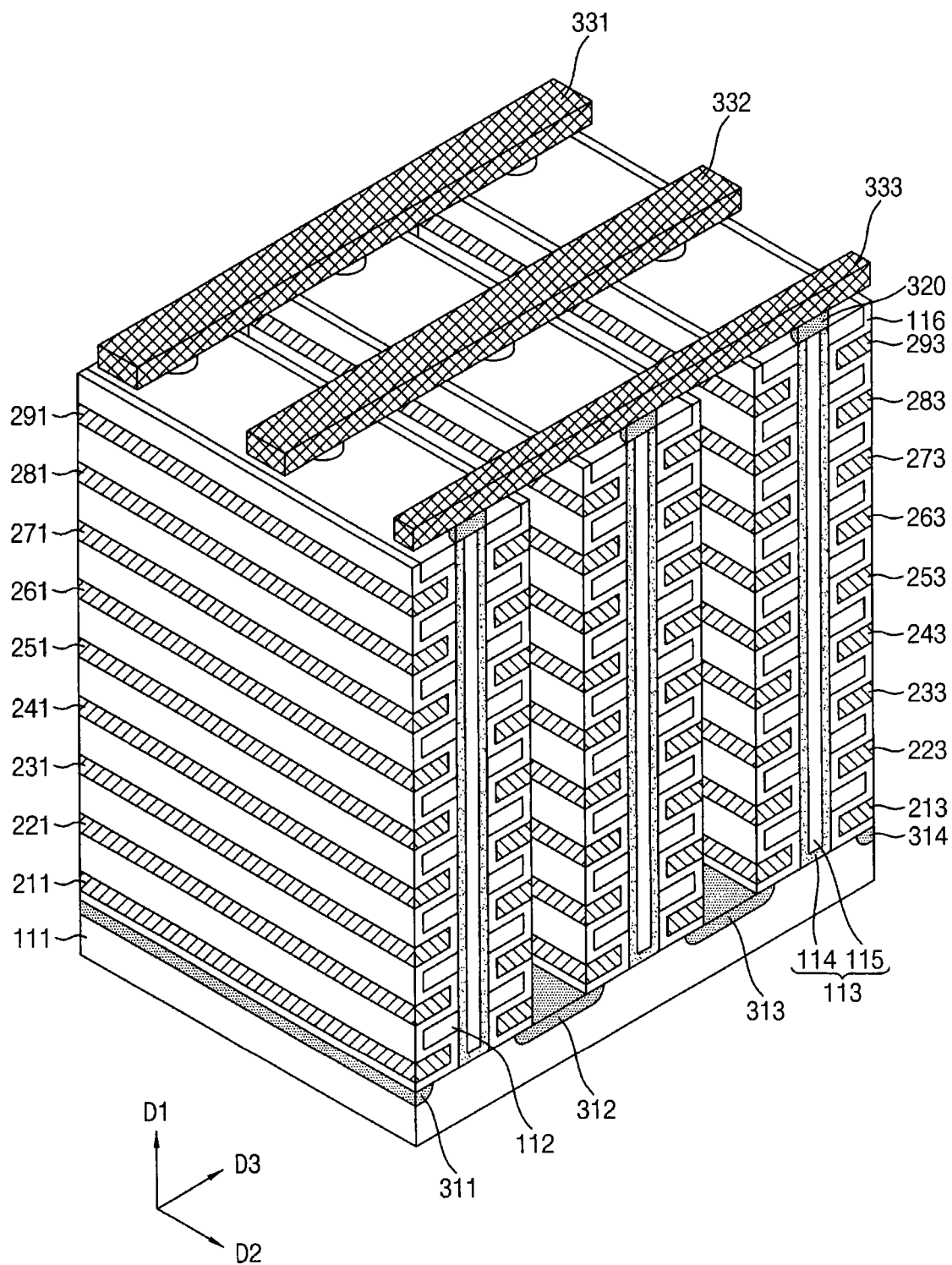
FIG. 6 is a perspective view illustrating one of memory blocks of FIG. 5 according to some embodiments of the present inventive concept.

FIG. 5 is a block diagram illustrating a memory cell array included in the nonvolatile memory device of FIG. 4, and FIG. 6 is a perspective view illustrating one of memory blocks of FIG. 5.

Referring to FIG. 5, the memory cell array 100 may include a plurality of memory blocks BLK1 to BLKz. In some embodiments, the memory blocks BLK1 to BLKz are selected by the address decoder 430 in FIG. 4. For example, the address decoder 430 may select a particular memory block BLK corresponding to a block address among the memory blocks BLK1 to BLKz.

Referring to FIG. 6, a memory block BLKi includes NAND strings which are formed on a substrate in a three-dimensional structure (or a vertical structure). The memory block BLKi includes structures extending along the first, second and third directions D1, D2 and D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In some embodiments, the substrate 111 has a p-type well (or a p-type pocket well). However, the conductive type of the substrate 111 is not limited to the p-type.

A plurality of doping regions 311 to 314 extending along the first direction D1 are provided in/on the substrate 111. For example, the plurality of doping regions 311 to 314 may have a second type (e.g., a second conductive type) different from the first type of the substrate 111. In some embodiments, the first to fourth doping regions 311 to 314 have an n-type. However, the conductive type of the first to fourth doping regions 311 to 314 is not limited to the n-type.

A plurality of insulation materials 112 extending along the first direction D1 are sequentially provided along the second direction D2 on a region of the substrate 111 between the first and second doping regions 311 and 312. For example, the plurality of insulation materials 112 are provided along the second direction D2, being spaced by a specific distance. For example, the insulation materials 112 may include an insulation material such as an oxide layer.

A plurality of pillars 113 penetrating the insulation materials along the second direction D2 are sequentially disposed along the first direction D1 on a region of the substrate 111 between the first and second doping regions 311 and 312. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In some embodiments, the channel layer 114 of each pillar 113 includes a p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In some examples, the inner material 115 of each pillar 113 may include an air gap.

An insulation layer 116 is provided along the exposed surfaces of the insulation materials 112, the pillars 113, and the substrate 111, on a region between the first and second doping regions 311 and 312.

A plurality of first conductive materials 211 to 291 are provided on surfaces of the insulation layer 116, in a region between the first and second doping regions 311 and 312. For example, the first conductive material 211 extending along the second direction D2 is provided between the insulation material 112 adjacent to the substrate 111 and the substrate 111. In more detail, the first conductive material 211 extending along the second direction D2 is provided between the insulation layer 116 at the bottom of the insulation material 112 adjacent to the substrate 111 and the substrate 111.

A first conductive material extending along the second direction D2 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the second direction D2 are provided between the insulation materials 112 and it may be understood that the insulation layer 116 is provided between the insulation materials 112 and the first conductive materials 221 to 281. The first conductive materials 211 to 291 may be formed of a conductive metal. In some examples, the first conductive materials 211 to 291 may include a conductive material such as a polysilicon.

Similar structures as those on the first and second doping regions 311 and 312 may be provided in a region between the second and third doping regions 312 and 313. In the region between the second and third doping regions 312 and 313, provided are a plurality of insulation materials 112 extending along the second direction D2, a plurality of pillars 113 disposed sequentially along the second direction D2 and penetrating the plurality of insulation materials 112 along the first direction D1, an insulation layer 116 provided on the exposed surfaces of the plurality of insulation materials 112 and the plurality of pillars 113, and a plurality of conductive materials 213 to 293 extending along the second direction D2.

Drains 320 are provided on the plurality of pillars 113, respectively. On the drains, the second conductive materials 331 to 333 extending along the third direction D3 are provided. The second conductive materials 331 to 333 are disposed along the second direction D2, being spaced by a specific distance. The second conductive materials 331 to 333 are respectively connected to the drains 320 in a corresponding region. The drains 320 and the second conductive material 333 extending along the third direction D3 may be connected through each contact plug. The second conductive materials 331 to 333 may include metal materials. The second conductive materials 331 to 333 may include conductive materials such as a polysilicon.

The layers in which the first conductive materials are formed correspond to gate layers and the first conductive materials may form gate lines such as a string selection line SSL, a word line WL, intermediate switching lines MSL, USL and LSL, a ground selection line GSL, etc. The second conductive materials may form a bit line BL.

Figure 7:
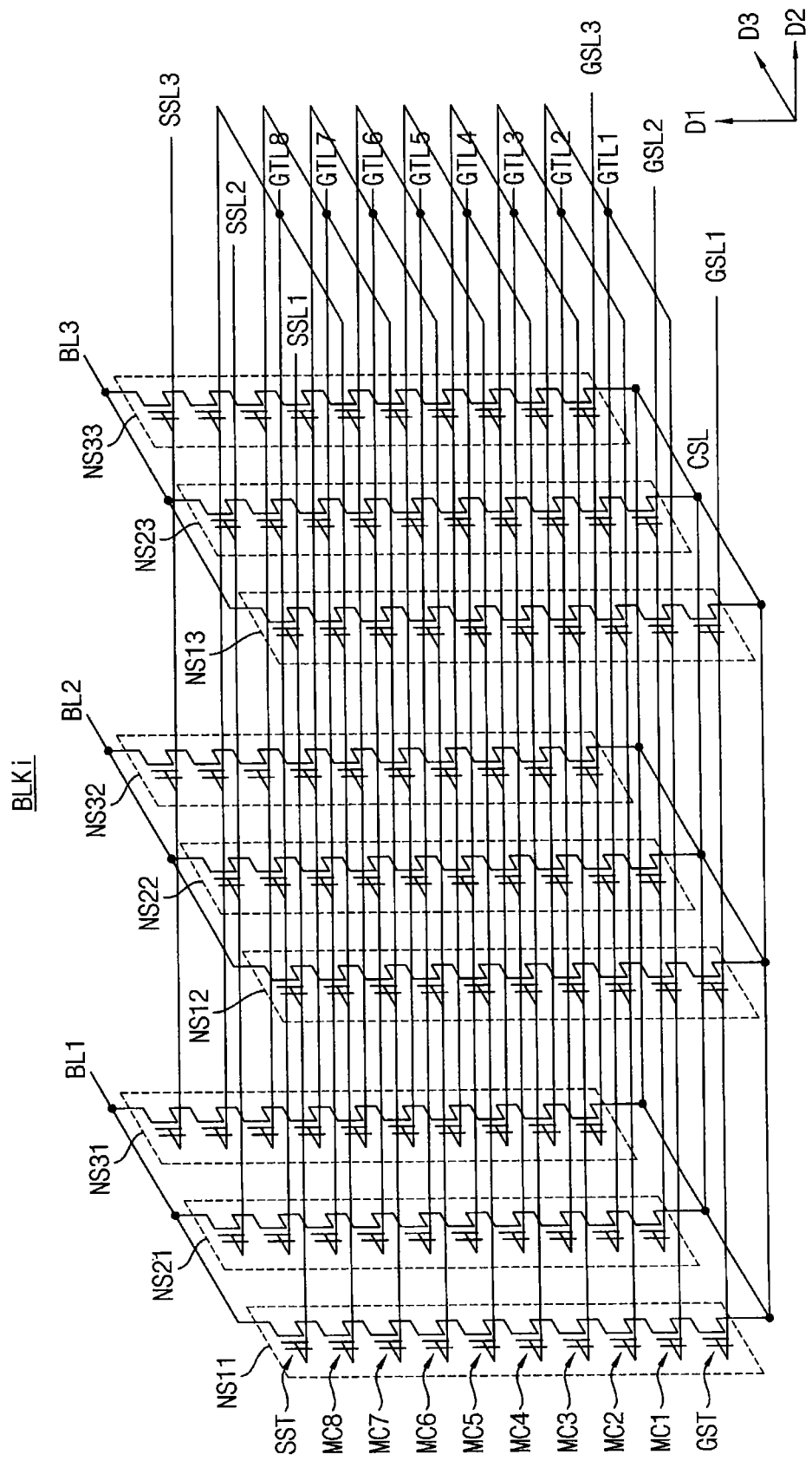
FIG. 7 is a circuit diagram illustrating an equivalent circuit of the memory block described with reference to FIG. 6 according to some embodiments of the present inventive concept.

FIG. 7 is a circuit diagram illustrating an equivalent circuit of the memory block described with reference to FIG. 6.

The memory block BLKi of FIG. 7 may be formed on a substrate in a three-dimensional structure (or a vertical structure). For example, a plurality of NAND strings or cell strings included in the memory block BLKi may be formed in the first direction D1 perpendicular to the upper surface of the substrate.

Referring to FIG. 7, the memory block BLKi may include NAND strings NS11 to NS33 coupled between bit lines BL1, BL2 and BL3 and a common source line CSL. Each of the NAND strings NS11 to NS33 may include a string selection transistor SST, a plurality of memory cells MC1 to MC8, and a ground selection transistor GST. In FIG. 7, each of the NAND strings NS11 to NS33 is illustrated to include eight memory cells MC1 to MC8. However, example embodiments are not limited thereto. In some example embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to corresponding gate lines GTL1 to GTL8, respectively. The gate lines GTL1 to GTL8 may be word lines and some of the gate lines GTL1 to GTL8 may be dummy word lines. In addition, some of the gate lines GTL1 to GTL8 may be intermediate switching lines and the memory cells connected to the intermediate switching lines may be referred to as intermediate switching transistors. Each ground selection transistor GST may be connected to a corresponding ground selection line (one of GSL1 to GSL3). Each string selection transistor SST may be connected to a corresponding bit line (e.g., one of BL1, BL2 and BL3), and each ground selection transistor GST may be connected to the common source line CSL.

Word lines (e.g., WL1) having the same height, i.e. a similar height from the substrate 111 of FIG. 6, may be commonly connected, and the ground selection lines GSL1 to GSL3 and the string selection lines SSL1 to SSL3 may be separated. Even though not illustrated, the gate lines corresponding to the intermediate switching lines may be separated as will be described below. In FIG. 7, the memory block BLKi is illustrated to be coupled to eight gate lines GTL1 to GTL8 and three bit lines BL1 to BL3. However, example embodiments are not limited thereto. Each memory block in the memory cell array 100 may be coupled to any number of word lines and any number of bit lines.

Figure 8:
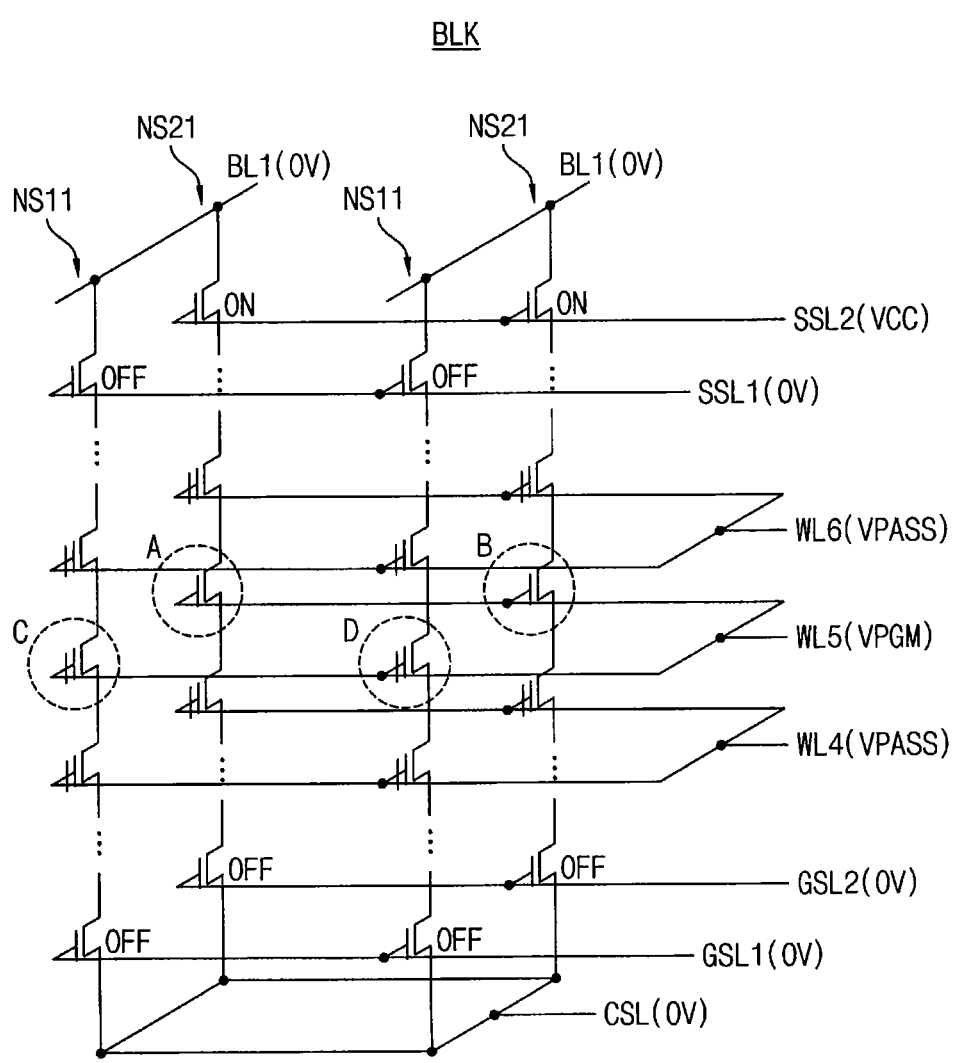
FIG. 8 is a circuit diagram illustrating a program bias condition of a three-dimensional flash memory device according to some embodiments of the present inventive concept.

FIG. 8 is a circuit diagram illustrating a program bias condition of a three-dimensional flash memory device.

For convenience of description, among a plurality of NAND strings of a memory block BLK, NAND strings NS11 and NS21 connected to a first bit line BL1 and NAND strings NS12 and NS22 connected to a second bit line BL2 are illustrated in FIG. 8.

The first bit line BL1 may be a program bit line to which a program permission voltage (e.g., 0 V) is applied, and the second bit line BL2 may be a program inhibition bit line to which a program inhibition voltage such as a power supply voltage Vcc is applied. If the NAND string NS21 among the NAND strings NS11 and NS21 is selected, during a program operation, a voltage of 0 V may be applied to a first string selection line SSL1, and the power supply voltage Vcc may be applied to a second string selection line SSL2.

The voltage of 0 V may be applied to ground selection lines GSL1 and GSL2. Furthermore, a voltage (e.g., Vcc) higher than 0 V may be applied to a common source line CSL. A program voltage Vpgm (e.g., 18 V) may be applied to a selected word line (e.g., WL5) and a pass voltage Vpass (e.g., 8 V) may be applied to unselected word lines (e.g., WL4 and WL6).

Under the program bias condition, a voltage of 18 V may be applied to a gate of a memory cell A having a channel voltage of 0 V. Since a strong electric field is formed between the gate and a channel of the memory cell A, the memory cell A may be programmed. However, since respective channels of memory cells C and D are in a floating state, channel voltages thereof may be boosted up to, for example, about 8 V, and thus, the memory cells C and D may not be programmed. The memory cell B may not be programmed because a weak electric field is formed between the gate of the memory cell B and the channel.

Figure 9:
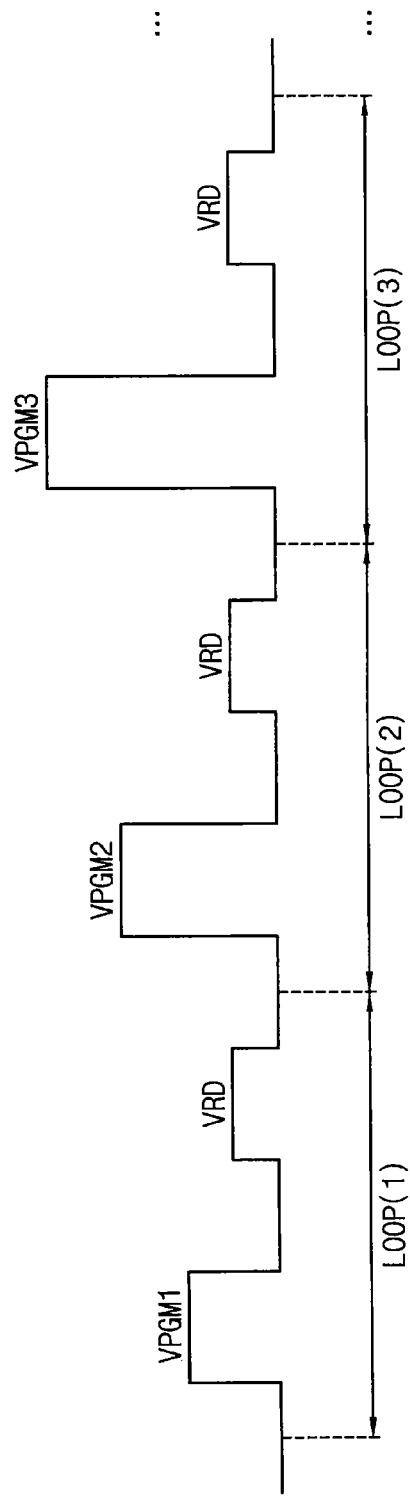
FIG. 9 is a diagram a plurality of program loops for incremental step pulse programming (ISPP) according to some embodiments of the present inventive concept.
Figure 10:
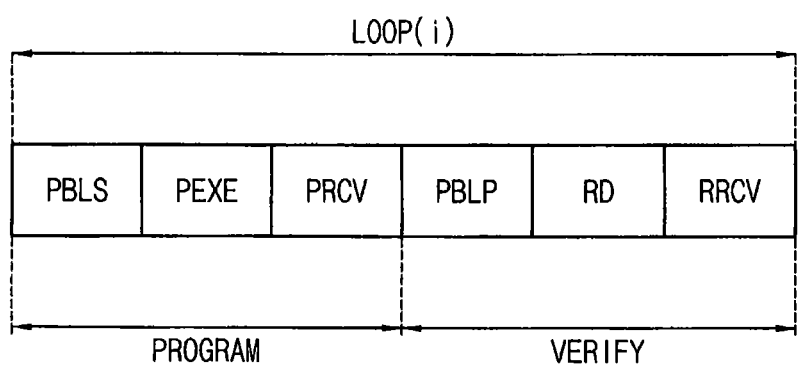
FIG. 10 is a diagram illustrating operation periods included in each program loop according to some embodiments of the present inventive concept.

FIG. 9 is a diagram a plurality of program loops for an incremental step pulse programming (ISPP), and FIG. 10 is a diagram illustrating operation periods included in each program loop.

Referring to FIGS. 9 and 10, a plurality of program loops LOOP(1), LOOP(2) and LOOP(3) are performed sequentially according to ISPP until the program operation is completed. As the program loops are repeated, the program voltages VPGM1, VPGM2 and VPGM3 may be increased sequentially.

Each program loop LOOP(i) may include a program period PROGRAM to apply each of the program voltages VPGM1, VPGM2 and VPGM3 to a selected word line for programming the selected memory cells and a verification period VERIFY to apply a verification read voltage VRD to the selected word line for verifying the success of the program operation.

The program period PROGRAM may include a bit line setup period PBLS, a program execution period PEXE and a program recovery period PRCV. The verification period VERIFY may include a bit line precharge period PBLP, a verification read period RD and a read recovery period RRCV. The bit line setup period PBLS, the program execution period PEXE, the program recovery period PRCV, the bit line precharge period PBLP, the verification read period RD and the read recovery period RRCV are the same as described with reference to FIG. 2.

Figure 11:
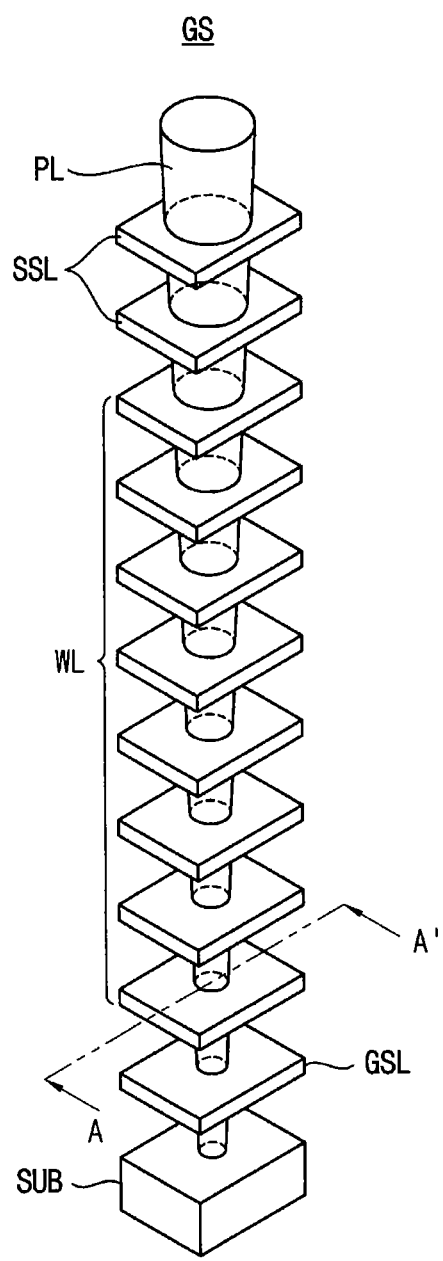
FIG. 11 is a diagram illustrating an example structure of a cell string according to some embodiments of the present inventive concept.
Figure 12:
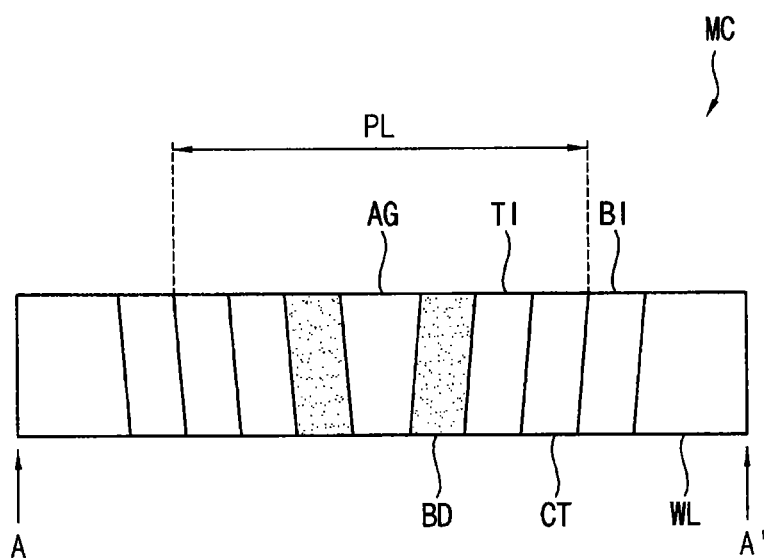
FIG. 12 is a diagram illustrating a memory cell included in the cell string of FIG. 11 according to some embodiments of the present inventive concept.

FIG. 11 is a diagram illustrating an example structure of a cell string, and FIG. 12 is a diagram illustrating a memory cell included in the cell string of FIG. 11.

Referring to FIGS. 6, 7, 11 and 12, a pillar PL extending in a vertical direction may be formed on a substrate SUB. The ground selection line GSL, the word lines WL and the string selection lines SSL may be formed of conductive materials such as metals, which are parallel to the substrate SUB. The pillar PL may penetrate the conductive materials forming the ground selection line GSL, the word lines WL and the string selection lines SSL to contact the substrate SUB. The word lines WL may include dummy word lines.

FIG. 12 illustrates a cross-sectional view cut along the line A-A' in FIG. 11. As an example, a cross-section of one memory cell MC corresponding to a word line is illustrated in FIG. 12. The pillar PL may include a body BD in a form of a cylinder, and an airgap AG may be provided in the body BD. The body BD may include silicon of a P-type and the body BD may be a region in which a channel is formed. The pillar PL may further include a tunnel insulation layer TI surrounding the body BD and a charge capturing layer CT surrounding the tunnel insulation layer T1. A blocking insulation layer BI may be provided between one word line and the pillar PL. The body BD, the tunnel insulation layer TI, the charge capturing layer CT, the blocking insulation layer BI and the one word line may form a transistor of a charge capturing type. In some example embodiments, the string selection transistor SST, the ground selection transistor GST and the other memory cells may have similar structure as illustrated in FIG. 12.

As illustrated in FIGS. 11 and 12, the width or the cross-section area of the pillar PL may be decreased as the distance to the substrate SUB is decreased. When the same voltage is applied to the bodies of the ground selection transistor GST, the memory cells MC and the string selection transistor SST, and the same voltage is applied to the ground selection line GLS, the word lines WL and the string selection line SSL, the electric field formed in the memory cell located near the substrate SUB is greater than the electric field formed in the memory cell located far from the substrate SUB. These characteristics affects the program disturbance during the program operation.

Figure 13:
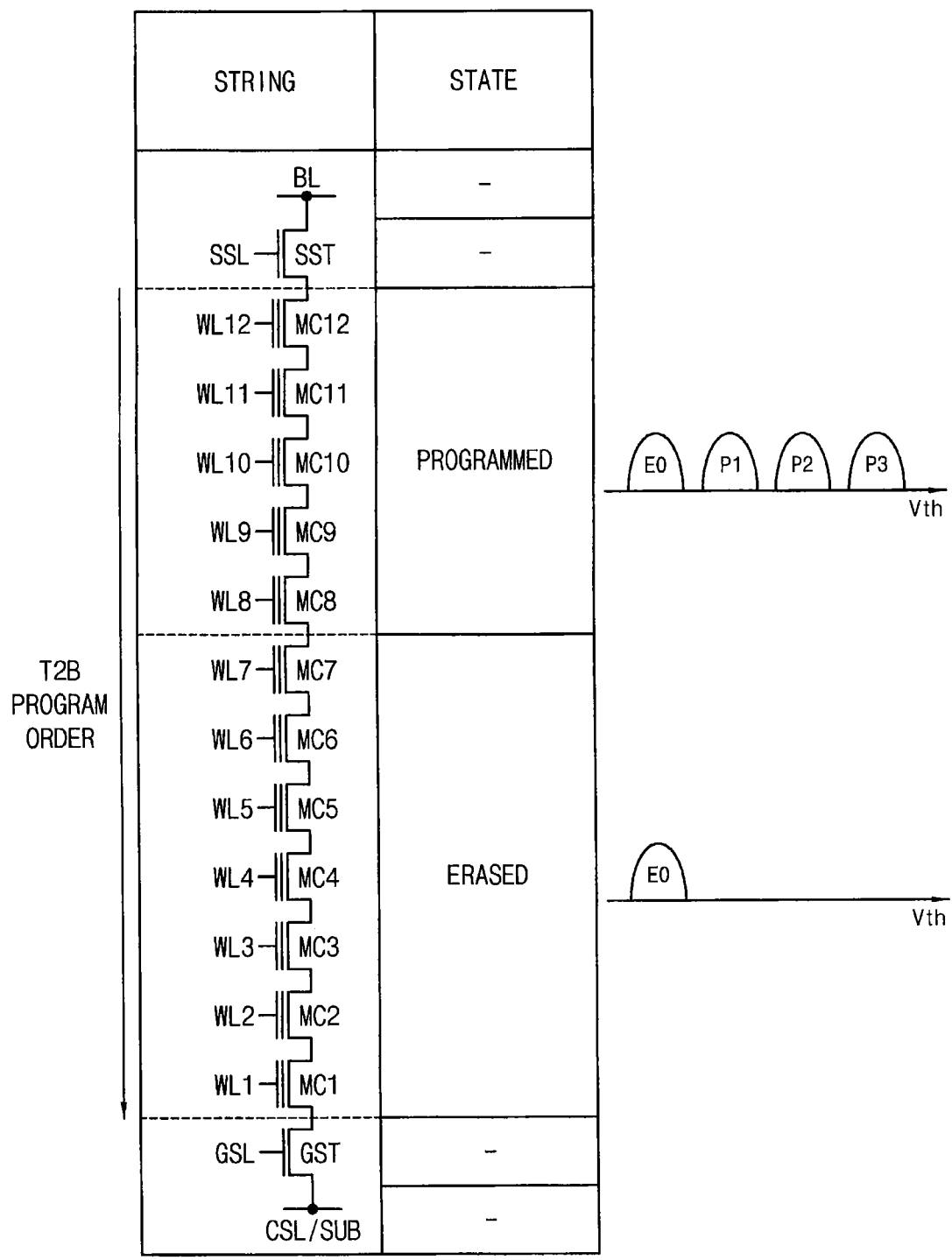
FIG. 13 is a diagram illustrating a programming operation according to example embodiments of the present inventive concept.

FIG. 13 is a diagram illustrating a programming operation according to example embodiments.

FIG. 13 illustrates one cell string STR including a string selection transistor SST connected to a string selection line SSL, a ground selection transistor GST connected to a ground selection line GSL and memory cells MC1~MC12 connected to word lines WL1~WL12 and states of memory cells. The cell string is connected between a bit line BL, a source line CSL and a substrate voltage SUB. FIG. 13 illustrates a non-limiting example of twelve memory cells and an MLC storing two bits. The number of the word lines and the bit number in the memory cell may be determined in various scenarios.

Referring to FIG. 13, according to a program scenario of a nonvolatile memory device, the program operation may be performed in a downward direction from an uppermost word line. In other words, as the data stored in the memory block increase, the data may be filled in erased cells in the downward direction from top to bottom (T2B program order). The not-programmed memory cells MC1~MC7 are in an erased state E0, and each of the programmed memory cells MC8~MC12 may be in one of the erased state E0 or programmed states P1, P2 and P3.

In a conventional B2T (bottom-to-top) program, an unselect string initial precharge (USIP) is performed through the string selection transistors during the bit line setup period. As described above, the three-dimensional NAND flash memory device is more vulnerable to the program disturbance as the size or the critical dimension (CD) of the channel hole is smaller. In case of a multiple level cell (MLC), the bit number programmed in each cell is increased. The number of the program loops is increased due to the increased number of the programmed states and thus the performance degradation due to the program disturbance is increased. Accordingly the program operation may be performed along the direction of a size decrease of the channel hole, that is, in the T2B program order as illustrated in FIG. 13. As such, when the program operation is performed along the direction of the size decrease of the channel hole, a bias voltage may be applied to the ground selection line and the USIP may be performed using the voltage of the source line.

FIGS. 14 through 18 are timing diagrams illustrating a method of programming a nonvolatile memory device according to example embodiments.

Figure 14:
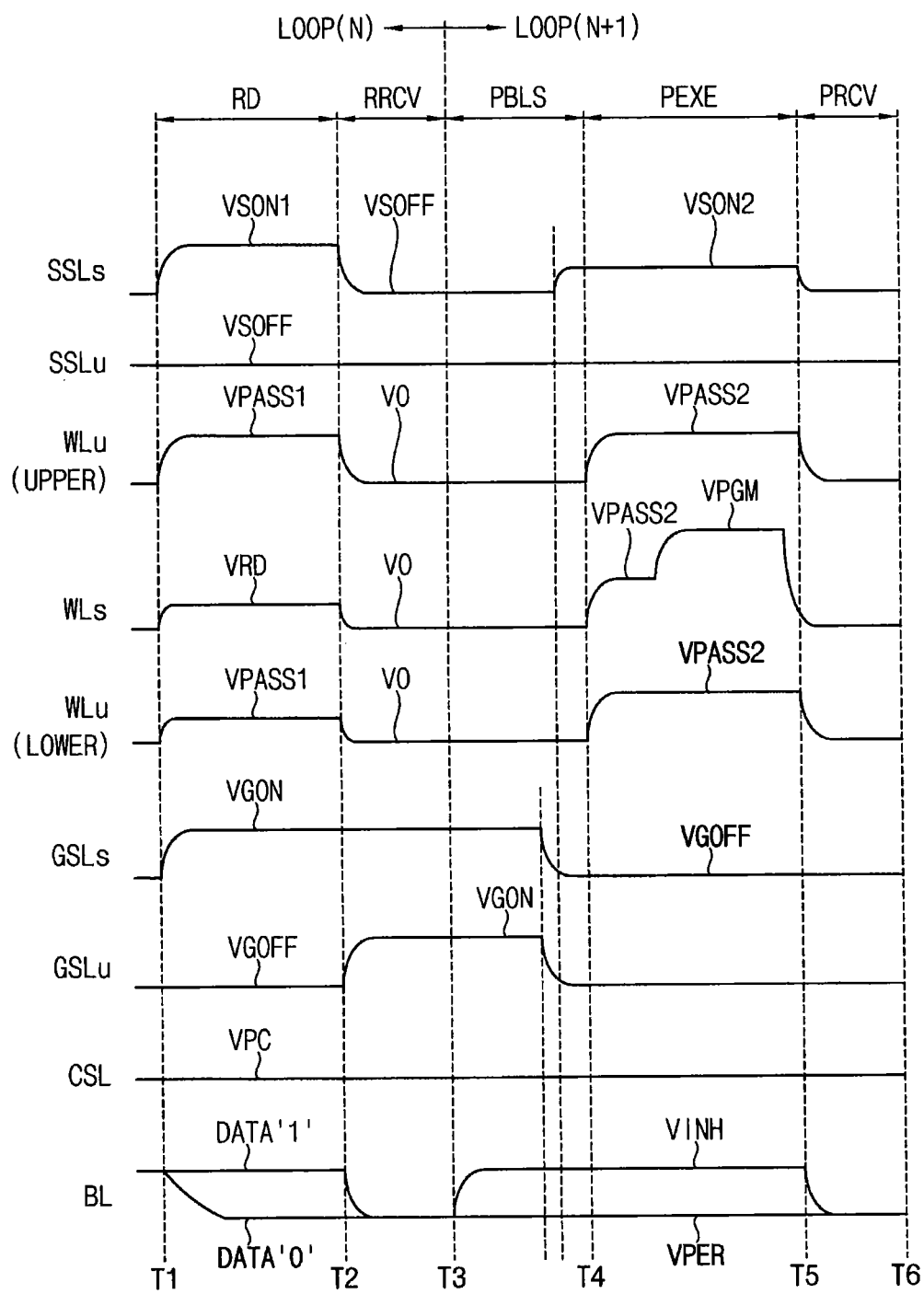
FIGS. 14 through 18 are timing diagrams of programming in a nonvolatile memory device according to example embodiments of the present inventive concept.

FIG. 14 illustrates a verification read period RD and a read recovery period RRCV of an N-th program loop LOO(N) and a bit line setup period PBLS, a program execution period PEXE and a program recovery period of an (N+1)-th program loop LOO(N+1). Time points T1~T6 represents boundaries of the periods.

Referring to FIG. 14, during the verification read period RD, a turn-on voltage VSON1 is applied to the selected string selection line SSLs and a turn-off voltage VSOFF is applied to an unselected string selection line SSLu. Thus a selected string selection transistor driven by the selected string selection line SSLs is turned on and an unselected string selection transistor driven by the unselected string selection line SSLu is turned off during the verification read period RD.

During the verification read period RD, a read pass voltage VPASS1 is applied to an unselected word line WLu and a verification read voltage VRD is applied to a selected word line WLs. The read pass voltage VPASS1 has a voltage level for turning on the memory cell regardless of its program state and the verification read voltage VRD has a voltage level for determining the threshold voltage level of a selected memory cell. WLu(UPPER) indicates a word line or word lines disposed above the selected word line WLs and WLu(LOWER) indicates a word line or word lines disposed below the selected word line WLs.

During the verification read period RD, a turn-on voltage VGON is applied to a selected ground selection line GSLs and a turn-off voltage VGOFF is applied to an unselected ground selection line GSLu. Thus a selected ground selection transistor driven by the selected ground selection line GSLs is turned on and an unselected ground selection transistor driven by the unselected ground selection line GSLu is turned off during the verification read period RD.

As a result, a voltage of a bit line is developed to a voltage corresponding to '1' or '0' depending on the threshold voltage state of the selected memory cell. The data stored in the selected memory cell may be determined by sensing the voltage development of the bit line. Even though not illustrated in FIG. 2, during a bit line precharge period before the verification read period RD, all of the bit lines may be initialized by the same bit line precharge voltage.

At the time point T2 of the end of the verification read period RD or the start of the read recovery period RRCV, the selected string selection line SSLs is recovered to the turn-off voltage VSOFF, the unselected word line WLu and the selected word line WLs are recovered to an initial voltage V0. In contrast, the turn-on voltage VGON of the selected ground selection line GSLs is not recovered and it is maintained at the time point T2 of the end of the verification read period RD. In addition, so as to expedite the precharge of the channels for the (N+1)-th program loop LOOP(N+1), the read pass voltage VPASS1 applied to the unselected word line WLu(LOWER) disposed below the selected word line WLs may be maintained to precharge the channels for the (N+1)-th program loop LOOP(N+1), without recovery even after the verification read period RD of the N-th program loop LOOP(N) is finished.

The turn-on voltage VGON of the selected ground selection line GSLs may be maintained without recovery after the time point T3 of the start of the bit line setup period PBLS. Accordingly the channel of the selected cell string may be precharged or initialized to a precharge voltage VPC during the read recovery period RRCV and the bit line setup period PBLS while the selected ground selection transistor is turned on.

In comparison with the example embodiment of FIG. 2 in which the turn-on voltage VGON is applied to the unselected ground selection line GSLu at the time point T3 of the start of the bit line setup period PBLS, the turn-on voltage VGON is applied to the unselected ground selection line GSLu at the time point T2 of the end of the verification read period RD in the example embodiment of FIG. 14. In this case, the precharge of the channel of all of the cell strings may be performed during the read recovery period RRCV of the N-th program loop LOOP(N) and the bit line setup period PBLS of the (N+1)-th program loop LOOP(N+1).

Conventionally, the turn-on voltage VGON of the selected ground selection line GSLs applied to the selected ground selection transistor is recovered to the turn-off voltage VGOFF at the time point T2 of the end of the verification read period RD, and then the turn-on voltage VGON is applied to the selected ground selection line GSLs in addition to the unselected ground selection line GSLu at the time point T3 of the start of the bit line setup period PBLS. In contrast, according to example embodiments, the turn-on voltage VGON of the selected ground selection line GSLs applied to the selected ground selection transistor is maintained to precharge the channels for an (N+1)-th program loop LOOP(N+1), without recovery even after the verification read period RD of the N-th program loop LOOP(N) is finished. The turn-on voltage VGON of the selected ground selection line GSLs and the unselected ground selection line GSLu may be recovered to the turn-off voltage VGOFF before the time point T4 of the start of the program execution period PEXE.

As such, the current due to the voltage transition of the selected ground selection line GSLs may be suppressed and thus the power consumption may be reduced by maintaining the turn-on voltage VGON of the selected ground selection line GSLs to precharge the channels of the cell strings without recovery even after the verification read operation RD is finished. In addition, the time point T3 of the start of the bit line setup period PBLS may be advanced by omitting the voltage recovery of the selected ground selection line GSLs and thus the entire program time may be reduced and the operation speed of the nonvolatile memory device may be enhanced.

At the time point T3 of the start of the bit line setup period PBLS, a program inhibition voltage VINH or a program permission voltage VPER may be applied to the bit line BL depending on the value of the write data.

At the time point T4 of the start of the program execution period PEXE, a program pass voltage VPASS2 is applied to the selected word line WLs and the unselected word line WLu and after a predetermined time interval a program voltage VPGM is applied to the selected word line WLs. During the program execution period PEXE, a turn-on voltage VSON2 is applied to the selected string selection line SSLs and the turn-off voltage VSOFF of the unselected string selection line SSLu is maintained. The turn-on voltage VSON2 during the program execution period PEXE may be lower than the turn-on voltage VSON1 during the verification read period RD.

The program pass voltage VPASS2 applied to the unselected word line WLu may be maintained until the time point T5 of the end of the program execution period PEXE, and the channel voltage of the unselected cell strings connected to the unselected string selection line SSLu may be increased by a self-boosting effect.

The selected memory cells connected to the selected word line WLs may be programmed by the program voltage VPGM applied to the selected word line WLs depending on the setup voltage of the bit line BL. The unselected cell string maintain the boosted state while the program voltage VPGM is applied to the selected word line WLs, and thus the programming of the memory cells of the unselected cell string connected to the selected word line WLs may be prevented.

At the time point T5 of the end of the program execution period PEXE or the start of the program recovery period PRCV, the turn-on voltage VSON2 of the selected string selection line SSLs is recovered to the turn-off voltage VSOFF, and the program pass voltage VPASS2 of the unselected word line WLu and the program voltage VPGM of the selected word line WLs are recovered to the initial voltage V0.

Hereinafter, example embodiments of FIGS. 15 through 18 are similar to those of FIGS. 2 and 14, and the repeated descriptions are omitted.

Figure 15:
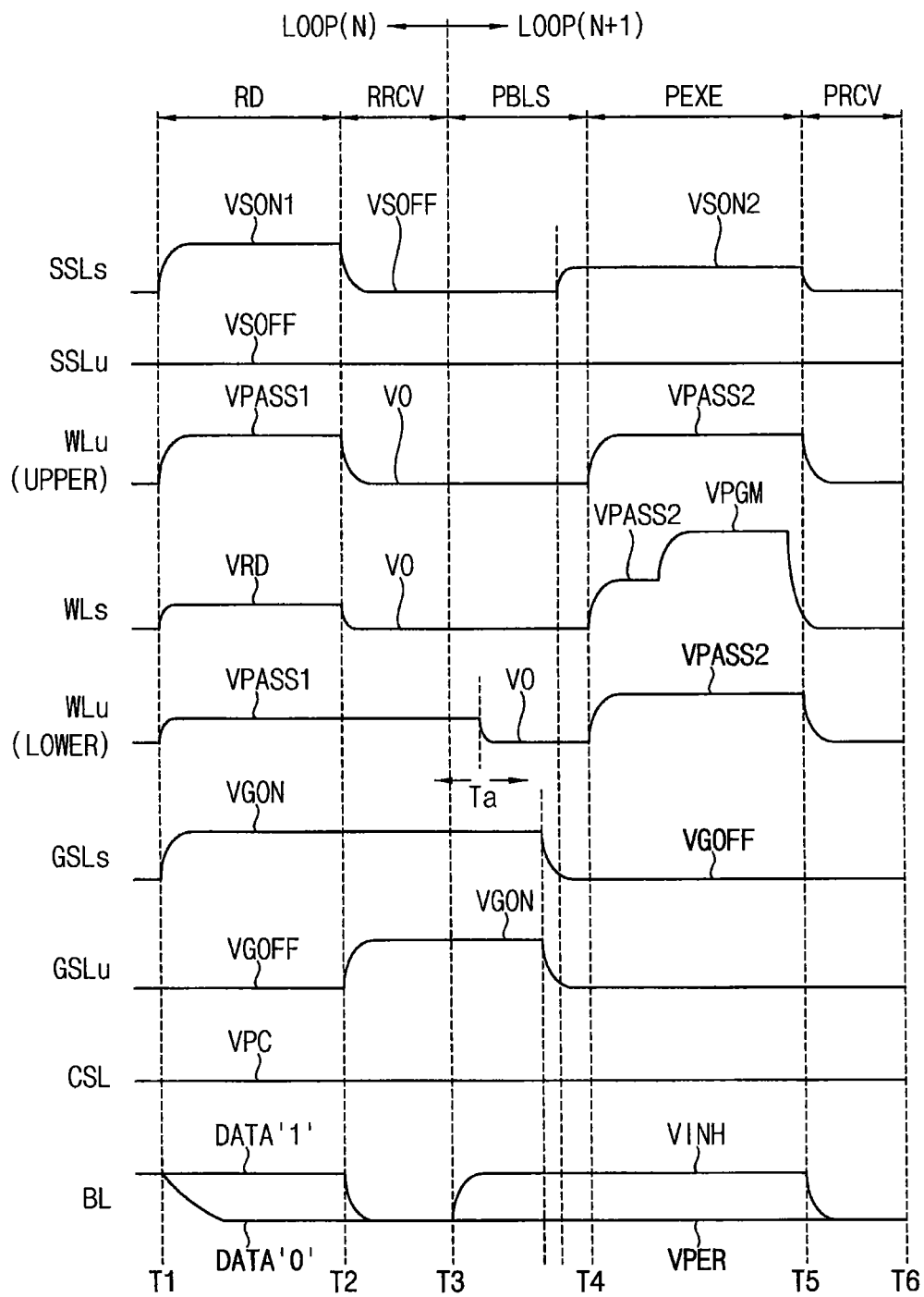

Referring to FIG. 15, a time point Ta of recovering the read pass voltage VPASS1 applied to the unselected word line WLu(LOWER) disposed below the selected word line WLu may be changed based on a location of the selected word line WLs. In some example embodiments, the time point Ta of recovering the read pass voltage VPASS1 may be further advanced as the selected word line WLs is located at a lower position, that is, as the selected word line WLs is located nearer the ground selection transistor. As the selected word line WLs is located lower, the number of the erased memory cells is decreased, that is, the length of the channel to be precharged is decreased, and thus the stress to the unselected memory cells by the unselected word lines WLu(LOWER) may be reduced by reducing the applying time of the read pass voltage VPASS1.

Figure 16:
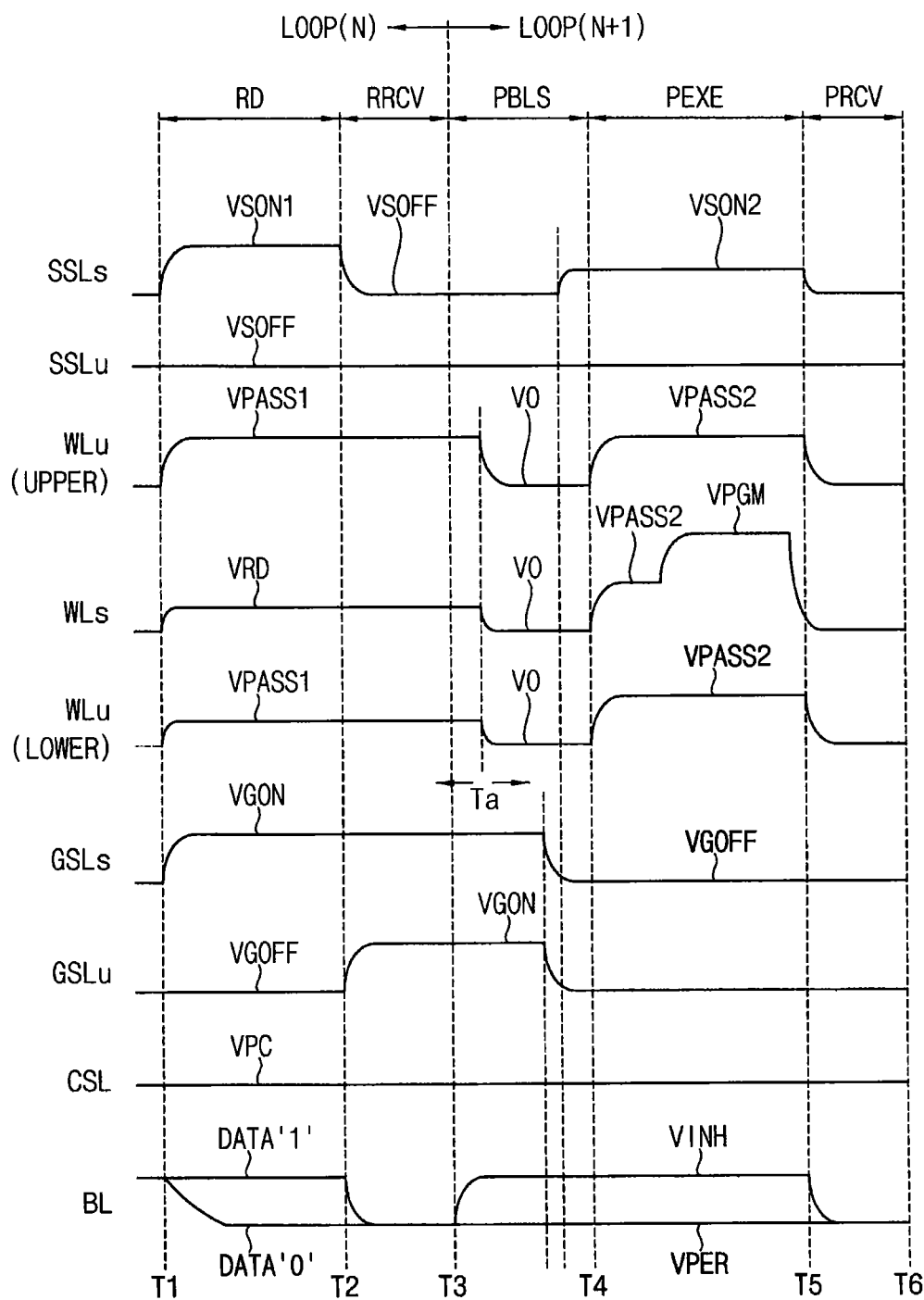

Referring to FIG. 16, the verification read voltage VRD applied to the selected word line WLs may be maintained to precharge the channels for the (N+1)-th program loop LOOP(N+1), without recovery even after the verification read period RD of the N-th program loop LOOP(N) is finished. In addition, the read pass voltage VPASS1 applied to the unselected word line WLu(UPPER) above the selected word line WLs and the unselected word line WLu(LOWER) below the selected word line WLs may be maintained to precharge the channels for the (N+1)-th program loop LOOP (N+1), without recovery even after the verification read period RD of the N-th program loop LOOP(N) is finished. As described with reference to FIG. 15, the time point Ta of recovering the verification read voltage VRD applied to the selected word line SWs and the read pass voltage VPASS1 applied to the unselected word lines WLu(LOWER) and WLu(UPPER) may be changed based on the location of the selected word line WLs.

Figure 17:
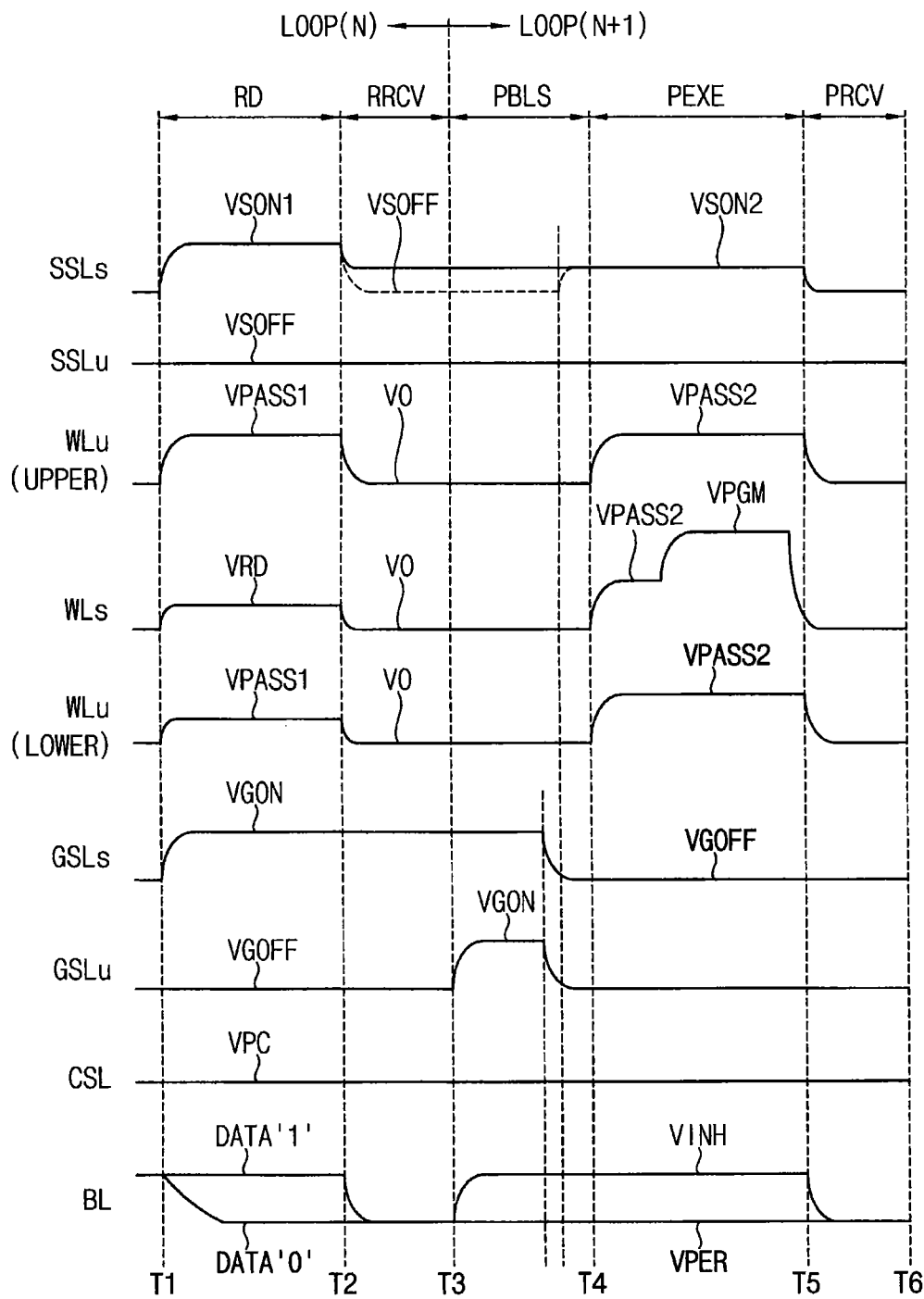

Referring to FIG. 17, a first turn-on voltage VSON1 may be applied to the selected string selection line SSLs driving the selected string selection transistor of the selected cell string among a plurality of cell strings during the verification read period RD of the N-th program loop LOOP(N). Based on a location of the selected word line WLs, a recovery of the turn-on voltage VSON1 applied to the selected string selection transistor of the selected cell string may be omitted even after the verification read period RD of the N-th program loop LOOP(N) is finished. In some example embodiments, when the position of the selected word line WLs is below a reference word line of which the position is predetermined, the recovery of the first turn-on voltage VSON1 to the turn-off voltage VSOFF may be omitted. This is because the memory cells above the selected memory cells are already in the programmed state.

In some example embodiments, as illustrated in FIG. 17, a second turn-on voltage VSON2 lower than the first turn-on voltage VSON1 may be applied to the selected string selection line SSLs at the time point T2 when the verification read period RD of the N-th program loop LOOP(N) is finished. The second turn-on voltage VSON2 may be maintained until the program execution period PEXE is finished. As such, the current due to the voltage transition of the selected string selection line SSLs and thus the power consumption of the nonvolatile memory device may be reduced.

Figure 18:
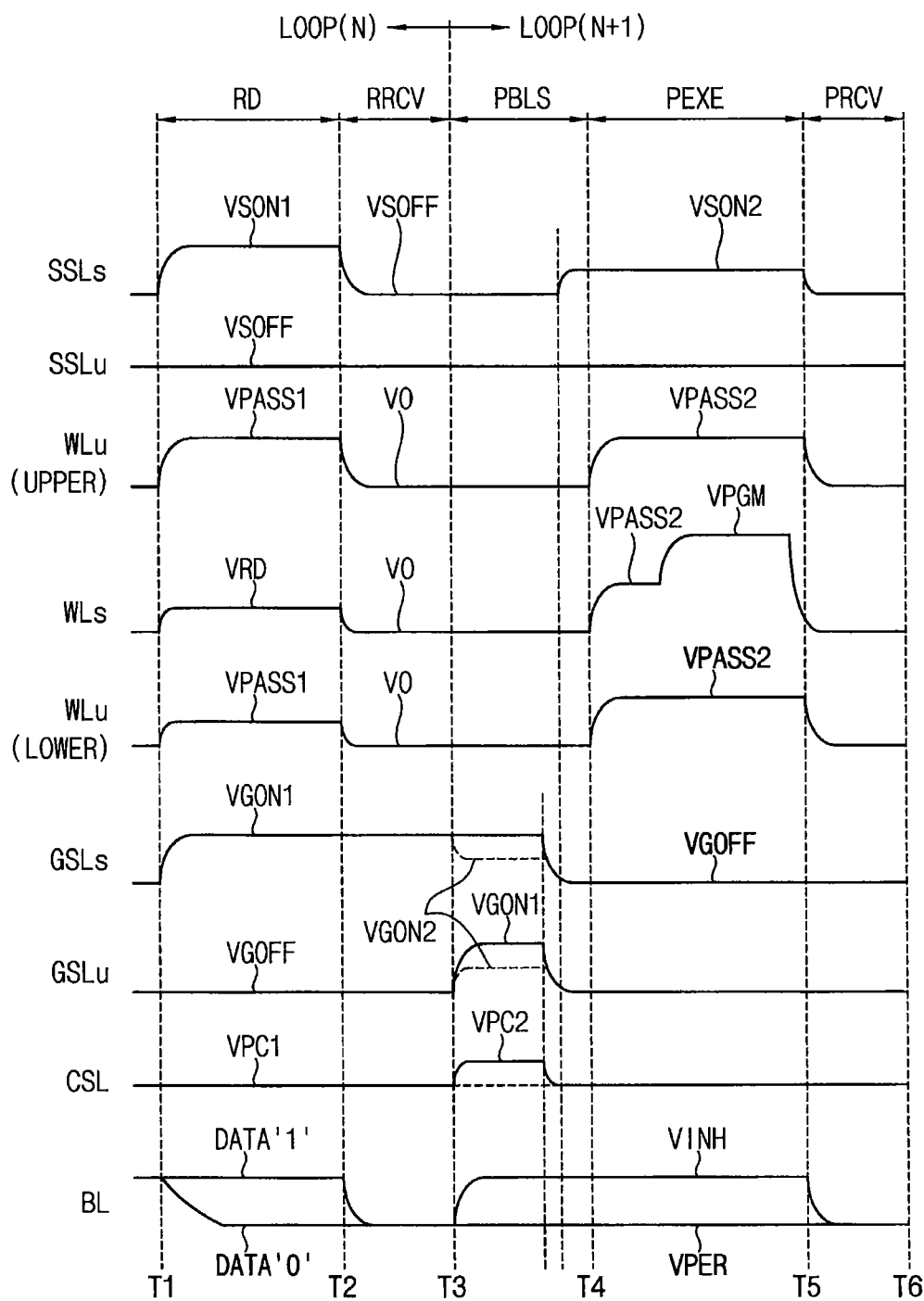

Referring to FIG. 18, based on a location of the selected word line WLs, the turn-on voltage applied to the ground selection lines GSLu and GSLs to precharge the channels may be changed. In some example embodiments, as the selected word line WLs is located lower, the turn-on voltage applied to the ground selection lines GSLu and GSLs to precharge the channels may be reduced. The first turn-on voltage VGON1 may be applied to the ground selection lines GSLu and GSLs when the selected word line WLs is located relatively upper, and the second turn-on voltage VGON2 lower than the first turn-on voltage VGON1 may be applied to the ground selection lines GSLu and GSLs when the selected word line WLs is located relatively lower. As the selected word line WLs is located lower, the number of the erased memory cells is decreased, that is, the length of the channel to be precharged is decreased, and thus the stress to the ground selection transistors may be reduced by reducing the turn-on voltage applied to the ground selection lines GSLu and GSLs.

In some example embodiments, the precharge voltage VPC of the source line CSL may be changed based on a number of performed program loops. In some example embodiments, as the number of the performed program loops is increased, the precharge voltage VPC of the source line CSL for the precharge of the channels may be increased. The first precharge voltage VPC1 may be applied to the source line CSL when the number of the performed program loops is relatively small and the second precharge voltage VPC2 higher than the first precharge voltage VPC1 may be applied to the source line CSL when the number of the performed program loops is relatively large. As the number of the performed program loop is increased, the voltage level of the program voltage VPGM is increased. Thus the precharge voltage may be increased so as to reduce the program disturbance due to a voltage difference between the program voltage VPGM and the channel voltage.

Figure 19:
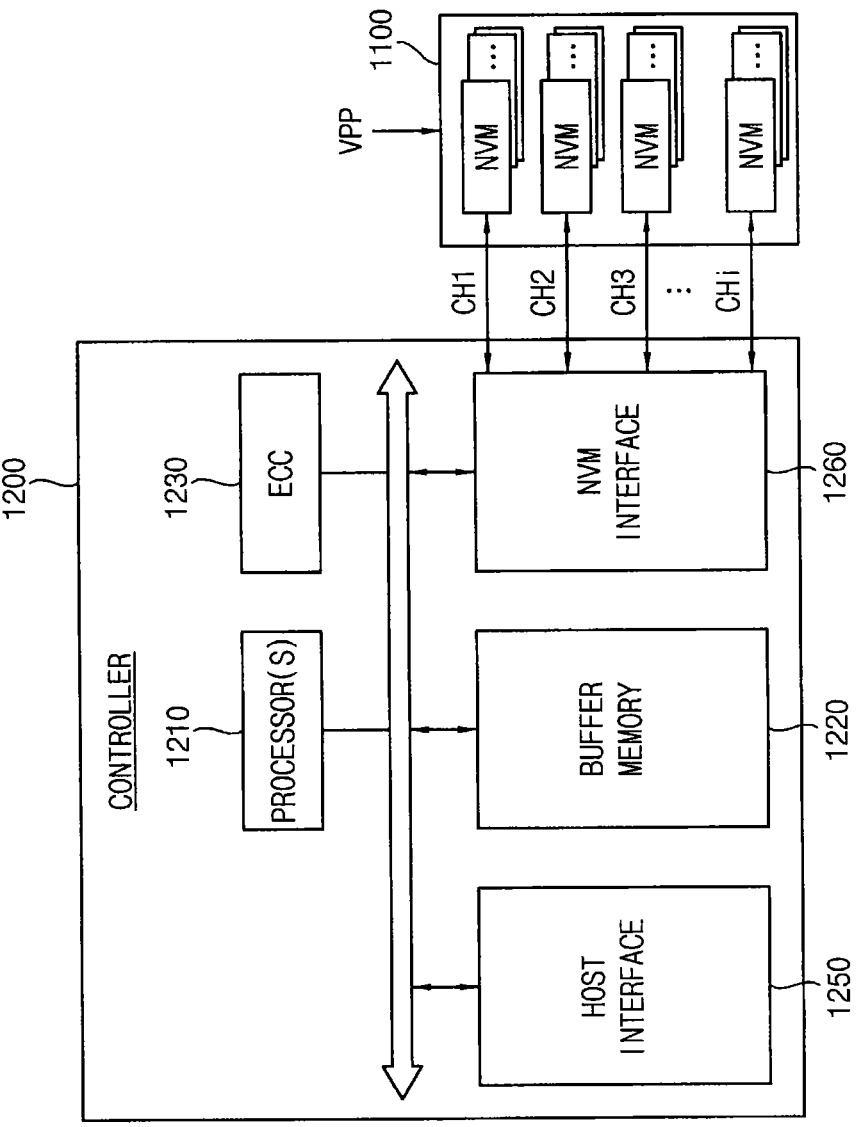
FIG. 19 is a block diagram illustrating a solid state disk or solid state drive (SSD) according to example embodiments of the present inventive concept.

FIG. 19 is a block diagram illustrating a solid state disk or solid state drive (SSD) according to example embodiments.

Referring to FIG. 19, an SSD 1000 includes multiple nonvolatile memory devices 1100 and an SSD controller 1200.

The nonvolatile memory devices 1100 may be configured optionally to receive a high voltage VPP. The nonvolatile memory devices 1100 may be the above-described memory devices disclosed above. The nonvolatile memory devices 1100 may include the intermediate switching transistors to implementing the local boosting of the string segment by selectively activating each of the intermediate switching transistors based on the program address.

The SSD controller 1200 is connected to the nonvolatile memory devices 1100 through multiple channels CH1 to CHi. The SSD controller 1200 includes one or more processors 1210, a buffer memory 1220, an error correction code (ECC) circuit 1230, a host interface 1250, and a nonvolatile memory interface 1260. The buffer memory 1220 stores data used to drive the SSD controller 1200. The buffer memory 1220 comprises multiple memory lines each storing data or a command. The ECC circuit 1230 calculates error correction code values of data to be programmed at a writing operation and corrects an error of read data using an error correction code value at a read operation. In a data recovery operation, The ECC circuit 1230 corrects an error of data recovered from the nonvolatile memory devices 1100.

As described above, the nonvolatile memory device and the programming method according to example embodiments may reduce power consumption and increase an operation speed by maintaining the turn-on voltage of the selected ground selection line to precharge the channels of the cell strings without recovery even after the verification read operation is finished.

The present inventive concept may be applied to a nonvolatile memory device and any electronic devices including the nonvolatile memory device. For example, the present inventive concept may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A method of programming a nonvolatile memory device comprising a plurality of cell strings, wherein a first cell string of the plurality of cell strings comprises a first string selection transistor, a first plurality of memory cells and a first ground selection transistor connected between a bit line and a source line, and wherein a second cell string of the plurality of cell strings comprises a second string selection transistor, a second plurality of memory cells and a second ground selection transistor connected between the bit line and the source line, the method comprising:

precharging a first channel of the first cell string through the first ground selection transistor by a precharge voltage of the source line and precharging a second channel of the second cell string through the second ground selection transistor by the precharge voltage of the source line;

applying a turn-on voltage to a selected ground selection transistor comprising the first ground selection transistor of a selected cell string comprising the first cell string, during a verification read period of an N-th program loop, wherein N is a natural number; and maintaining the turn-on voltage applied to the selected ground selection transistor to further precharge the first channel of the first cell string for an (N+1)-th program loop, without recovery after the verification read period of the N-th program loop is finished.

2. The method of claim 1, further comprising:

applying a turn-off voltage to an unselected ground selection transistor comprising the second ground selection transistor of an unselected cell string comprising the second cell string during the verification read period of the N-th program loop; and applying the turn-on voltage to the unselected ground selection transistor to further precharge a second channel of the second cell string for the (N+1)-th program loop after a time point when the verification read period of the N-th program loop is finished.

3. The method of claim 2, wherein the second channel is further precharged during a read recovery period of the N-th program loop and a bit line setup period of the (N+1)-th program loop.

4. The method of claim 1, further comprising:

applying a verification read voltage to a selected word line among a plurality of word lines during the verification read period of the N-th program loop;

applying a read pass voltage to an unselected word line among the plurality of word lines during the verification read period of the N-th program loop; and maintaining the read pass voltage applied to the unselected word line when the unselected word line is below the selected word line to further precharge channels comprising the first channel and the second channel for the (N+1)-th program loop, without recovery after the verification read period of the N-th program loop is finished.

5. The method of claim 4, further comprising:

changing a time point of recovering the read pass voltage applied to the unselected word line that is below the selected word line, based on a location of the selected word line.

6. The method of claim 5, wherein the time point of recovering the read pass voltage is further advanced in time as the selected word line is located at a lower position on the first cell string.

7. The method of claim 4, further comprising:

maintaining the verification read voltage applied to the selected word line to further precharge the first channel of the first cell string for the (N+1)-th program loop, without recovery after the verification read period of the N-th program loop is finished; and maintaining the read pass voltage applied to the unselected word line when the unselected word line is above the selected word line to further precharge the second channel of the second cell string for the (N+1)-th program loop, without recovery after the verification read period of the N-th program loop is finished.

8. The method of claim 1, further comprising:

applying a first string turn-on voltage to a selected string selection transistor comprising the first string selection transistor of the selected cell string, during the verification read period of the N-th program loop; and based on a location of a selected word line among a plurality of word lines, refraining from recovery of the first string turn-on voltage applied to an unselected string selection transistor comprising the second string selection transistor to further precharge a second channel of the second cell string for the (N+1)-th program loop after the verification read period of the N-th program loop is finished.

9. The method of claim 8, wherein the refraining from recovery of the first string turn-on voltage is responsive to the selected word line being located below a reference word line.

10. The method of claim 8, further comprising:

applying a second string turn-on voltage lower than the first string turn-on voltage to the selected string selection transistor after a time point when the verification read period of the N-th program loop is finished.

11. The method of claim 1, further comprising:

changing the turn-on voltage applied to the selected ground selection transistor to further precharge the first channel of the first cell string, based on a location of a selected word line among a plurality of word lines.

12. The method of claim 11, wherein the turn-on voltage applied to the selected ground selection transistor to further precharge the first channel of the first cell string is further decreased when the selected word line is located at a lower position on the first cell string than an unselected word line.

13. The method of claim 1, further comprising:

changing the precharge voltage of the source line based on a number of performed program loops.

14. The method of claim 13, wherein changing the precharge voltage of the source line based on the number of performed program loops comprises:

increasing the precharge voltage of the source line as the number of the performed program loops is increased.

15. The method of claim 1, wherein the first cell string of the plurality of cell strings comprises a channel hole having a decreasing size toward a bottom end of the channel hole, and wherein ones of the first plurality of the memory cells are programmed earlier as the ones of the first plurality of the memory cells are located at an upper position on the first cell string.

16. A method of programming a nonvolatile memory device comprising a plurality of cell strings, wherein a first cell string of the plurality of cell strings comprises a first string selection transistor, a first plurality of memory cells and a first ground selection transistor connected between a bit line and a source line, and wherein a second cell string of the plurality of cell strings comprises a second string selection transistor, a second plurality of memory cells and a second ground selection transistor connected between the bit line and the source line, the method comprising:

applying a turn-on voltage to a selected ground selection transistor comprising the first ground selection transistor of a selected cell string comprising the first cell string, during a verification read period of an N-th program loop, wherein N is a natural number;

maintaining the turn-on voltage applied to the selected ground selection transistor, without recovery after the verification read period of the N-th program loop is finished;

applying the turn-on voltage to an unselected ground selection transistor comprising the second ground selection transistor of an unselected cell string comprising the second cell string after a time point when the verification read period of the N-th program loop is finished; and precharging a first channel of the first cell string through the first ground selection transistor by a precharge voltage of the source line during a read recovery period of the N-th program loop and a bit line setup period of an (N+1)-th program loop, to program the (N+1)-th program loop.

17. The method of claim 16, further comprising:
based on a location of a selected word line among a plurality of word lines, changing a time point of recovering a read pass voltage applied to an unselected word line below the selected word line among the plurality of word lines.

18. The method of claim 16, further comprising:
based on a location of a selected word line among a plurality of word lines, refraining from recovery of the turn-on voltage applied to a selected string selection transistor of the selected cell string after the verification read period of the N-th program loop is finished.

19. The method of claim 16, further comprising:
based on a location of a selected word line among a plurality of word lines, changing the turn-on voltage applied to the first ground selection transistor and the second ground selection transistor to further precharge the first channel of the first cell string and a second channel of the second cell string.

20. A nonvolatile memory device comprising:
at least one memory block comprising a plurality of cell strings, the plurality of cell strings comprising a first cell string comprising a first string selection transistor, a first plurality of memory cells and a first ground selection transistor connected between a bit line and a source line and a second cell string of the plurality of cell strings comprising a second string selection transistor, a second plurality of memory cells and a second ground selection transistor connected between the bit line and the source line; and a control circuit configured to control a program operation such that a turn-on voltage is applied to a selected ground selection transistor comprising the first ground selection transistor of a selected cell string comprising the first cell string among the plurality of cell strings to precharge a first channel of the first cell string for an (N+1)-th program loop, without recovery after a verification read period of an N-th program loop is finished.

* * * * *